US012666692B2

(12) United States Patent
Orr et al.

(10) Patent No.: US 12,666,692 B2
(45) Date of Patent: Jun. 23, 2026

(54) VERTICAL DIODES IN STACKED TRANSISTOR TECHNOLOGIES

(71) Applicant: INTEL CORPORATION, Santa Clara, CA (US)

(72) Inventors: Benjamin Orr, Beaverton, OR (US); Nicholas A. Thomson, Hillsboro, OR (US); Ayan Kar, Portland, OR (US); Nathan D. Jack, Forest Grove, OR (US); Kalyan C. Kolluru, Portland, OR (US); Patrick Morrow, Portland, OR (US); Cheng-Ying Huang, Hillsboro, OR (US); Charles C. Kuo, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 559 days.

(21) Appl. No.: 17/448,373

(22) Filed: Sep. 22, 2021

(65) Prior Publication Data

US 2023/0089395 A1 Mar. 23, 2023

(51) Int. Cl.
H10D 84/01 (2026.01)
H10D 8/00 (2025.01)
(Continued)

(52) U.S. Cl.
CPC ............. H10D 84/01 (2025.01); H10D 8/045 (2025.01); H10D 84/017 (2025.01);
(Continued)

(58) Field of Classification Search
CPC .......... H10D 8/50; H10D 8/045; H10D 88/00; H10D 62/118–123; H10D 62/128;
(Continued)

(56) References Cited

U.S. PATENT DOCUMENTS 11,158,634 B1 * 10/2021 Huang ................. H10D 30/024
11,588,104 B2 * 2/2023 Cheng ................ H10N 70/8833
(Continued)

OTHER PUBLICATIONS

Extended European Search Report received for EP application No. 22184327.9, dated Dec. 19, 2022. 11 pages.

*Primary Examiner* — Wael M Fahmy
*Assistant Examiner* — Thomas Wilson Mccoy
(74) *Attorney, Agent, or Firm* — Arcane Law PLLC

(57) ABSTRACT

Integrated circuits including vertical diodes. In an example, a first transistor is above a second transistor. The first transistor includes a first semiconductor body extending laterally from a first source or drain region. The first source or drain region includes one of a p-type dopant or an n-type dopant. The second transistor includes a second semiconductor body extending laterally from a second source or drain region. The second source or drain region includes the other of the p-type dopant or the n-type dopant. The first source or drain region and second source or drain region are at least part of a diode structure, which may have a PN junction (e.g., first and second source/drain regions are merged) or a PIN junction (e.g., first and second source/drain regions are separated by an intrinsic semiconductor layer, or a dielectric layer and the first and second semiconductor bodies are part of the junction).

25 Claims, 18 Drawing Sheets

(51) Int. Cl.
| | |
|---|---|
| *H10D 8/01* | (2025.01) |
| *H10D 84/03* | (2025.01) |
| *H10D 84/80* | (2025.01) |
| *H10D 84/85* | (2025.01) |
| *H10D 88/00* | (2026.01) |

(52) U.S. Cl.
CPC ......... *H10D 84/038* (2025.01); *H10D 84/811* (2025.01); *H10D 84/856* (2025.01); *H10D 88/00* (2025.01)

(58) Field of Classification Search
CPC ............. H10D 62/129; H10D 30/6211; H10D 30/024–0245; H10D 30/62–6219; H10D 84/0158; H10D 84/0193; H10D 84/834; H10D 84/853; H10D 86/011; H10D 86/215; H10D 8/00–825; H10D 8/411; H10D 8/422; H10D 84/204; H10D 84/221; H10D 84/811–817; H10D 84/611619; H10D 84/403–409; H10D 84/00; H10D 89/611; H01L 23/00; H01L 2924/13067; H03G 1/0058; H10B 12/36; H10B 12/056; H10B 99/16
See application file for complete search history.

(56) References Cited

U.S. PATENT DOCUMENTS

| | | | |
|---|---|---|---|
| 2014/0209864 A1* | 7/2014 | Bangsaruntip ..... | H10D 30/6737 |
| | | | 257/29 |
| 2020/0258881 A1* | 8/2020 | Lilak ...................... | H10D 86/40 |
| 2021/0183850 A1 | 6/2021 | Nidhi et al. | |
| 2021/0210349 A1 | 7/2021 | Xie et al. | |
| 2023/0087444 A1* | 3/2023 | Thomson ............. | H10D 64/017 |
| | | | 257/351 |

* cited by examiner

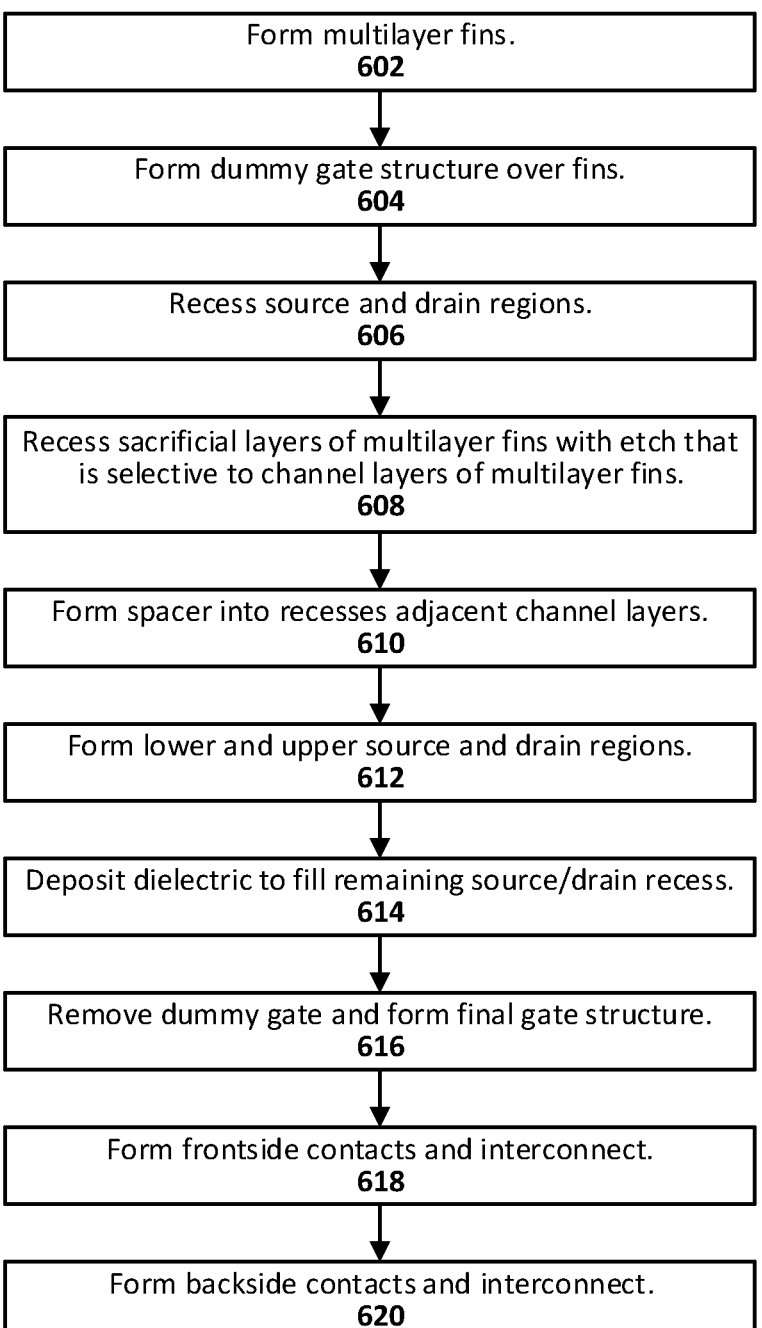

Form multilayer fins.
602

Form dummy gate structure over fins.
604

Recess source and drain regions.
606

Recess sacrificial layers of multilayer fins with etch that is selective to channel layers of multilayer fins.
608

Form spacer into recesses adjacent channel layers.
610

Form lower and upper source and drain regions.
612

Deposit dielectric to fill remaining source/drain recess.
614

Remove dummy gate and form final gate structure.
616

Form frontside contacts and interconnect.
618

Form backside contacts and interconnect.
620

Fig. 6

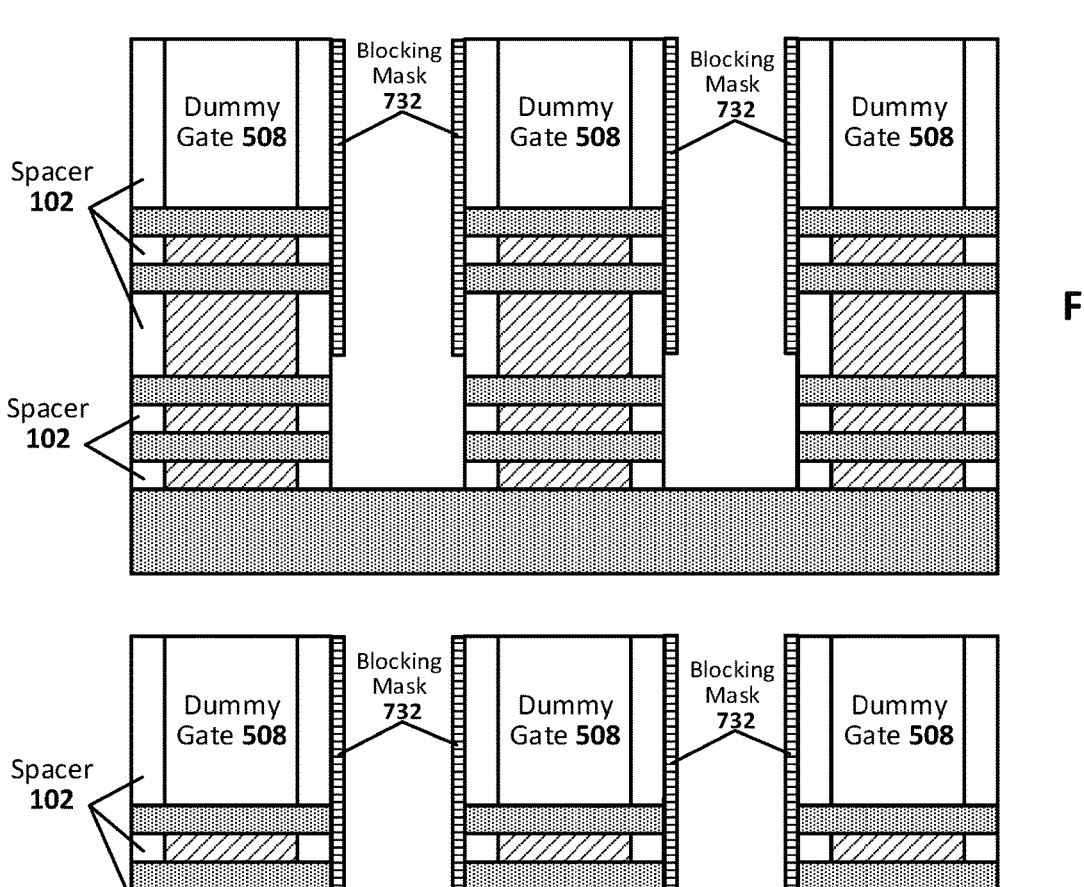
Fig. 8d
Fig. 8e
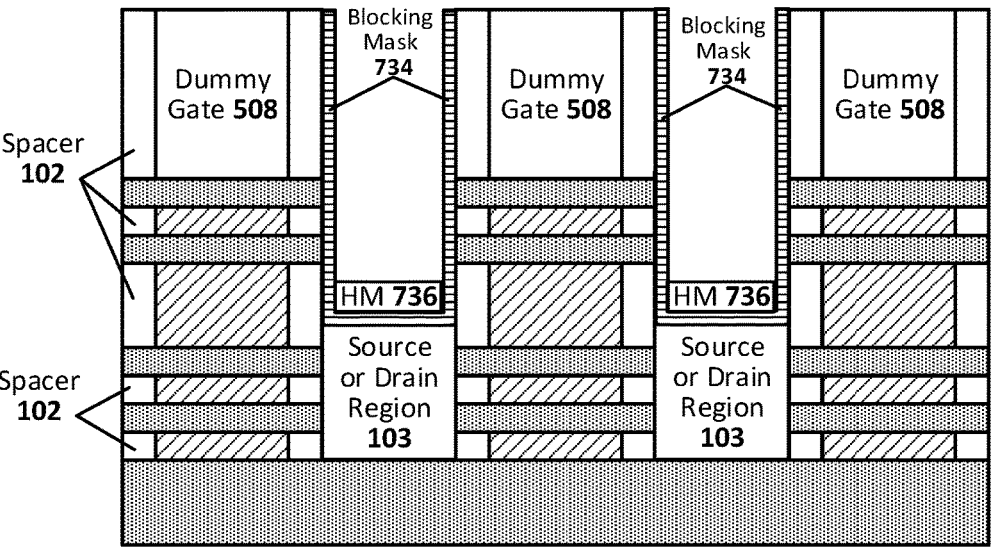
Fig. 8f

VERTICAL DIODES IN STACKED TRANSISTOR TECHNOLOGIES

FIELD OF THE DISCLOSURE

The present disclosure relates to integrated circuits, and more particularly, to vertical diodes in stacked transistor technologies.

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the z-dimension (build upwards rather than laterally outwards in the x- and y-dimensions). Some such 3D integrated circuits are formed utilizing a technique known as layer transfer. Such layer transfer may include, for instance, bond and hydrogen-based or hydrogen/helium based cleave techniques. Other 3D integrated circuits are formed by separately forming transistors on two distinct wafers (sometimes referred to as host and donor wafers or substrates), the two wafers being bonded together via an oxide bonding layer. Excess wafer material is removed by chemical-mechanical polish (CMP) operations. Still other 3D integrated circuits are achieved by forming transistors on upper and lower regions of the same fin structure. In any such cases, such 3D integration schemes provide a stacked transistor architecture and give rise to a number of non-trivial issues.

BRIEF DESCRIPTION OF THE DRAWINGS

FIG. 6 illustrates an example method for forming an integrated circuit configured with vertical diodes, in accordance with an embodiment of the present disclosure.

FIGS. 8a-8j are cross-sectional views that further illustrate the method of FIG. 7, in accordance with an embodiment of the present disclosure.

DETAILED DESCRIPTION

Figure 1A:
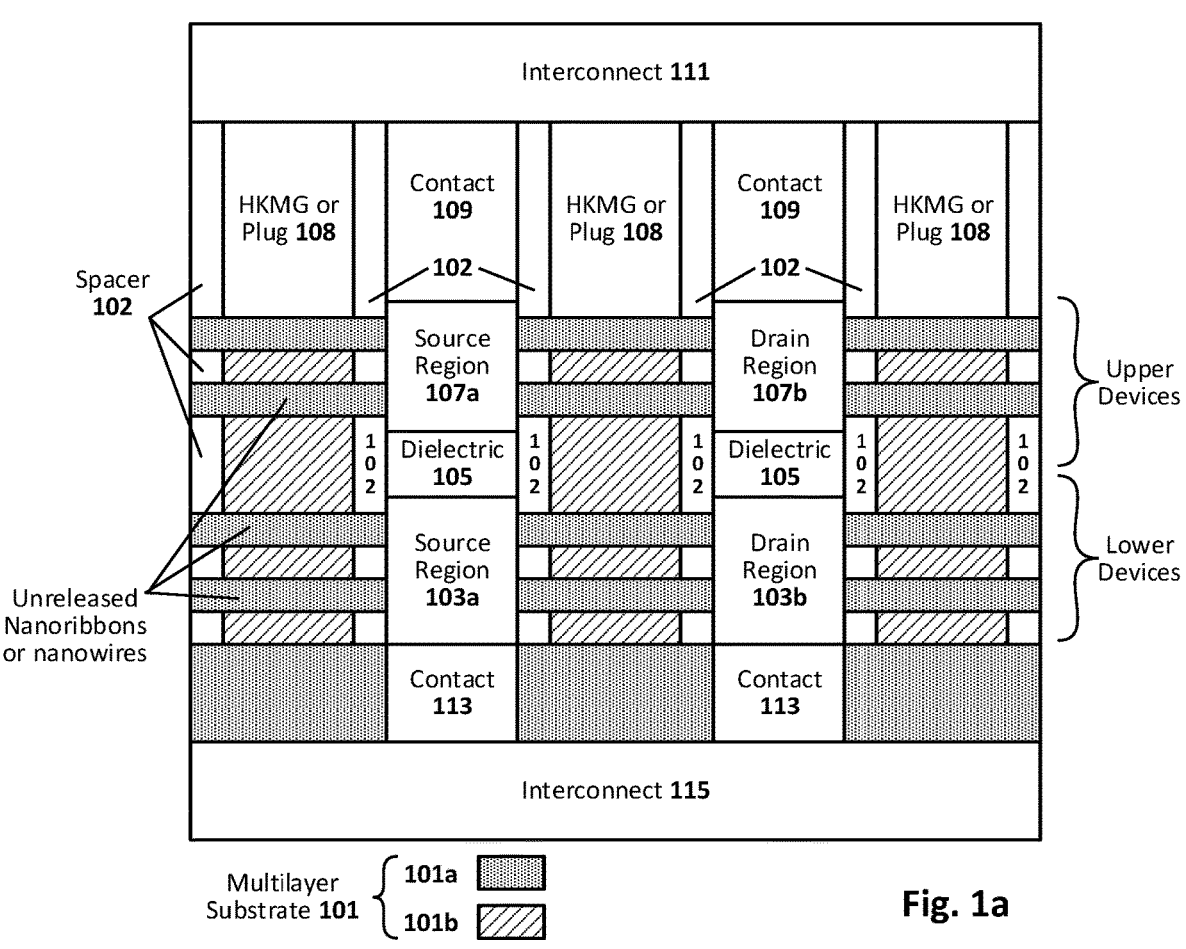
FIG. 1a is a cross-sectional view that illustrates an example integrated circuit configured with a vertical diode, in accordance with an embodiment of the present disclosure.

Integrated circuit structures including vertical diodes are provided herein. In an example, an integrated circuit includes a first transistor and a second transistor above the first. The first transistor includes a first semiconductor body extending laterally from a first source or drain region. The first source or drain region includes one of a p-type dopant or an n-type dopant. The second transistor includes a second semiconductor body extending laterally from a second source or drain region. The second source or drain region includes the other of the p-type dopant or the n-type dopant. The first source or drain region and second source or drain region are at least part of a diode structure. In some examples, the integrated circuit includes a layer of dielectric material between the first source or drain region and the second source or drain region, and the diode junction of the diode structure is provided at least in part by the first source or drain region, the first semiconductor body, the second semiconductor body, and the second source or drain region. In some such cases, the integrated circuit includes a third semiconductor body between the first and second semiconductor bodies, and the diode junction is provided at least in part by the first source or drain region, the first semiconductor body, the second semiconductor body, the third semiconductor body, and the second source or drain region. In some such cases, at least one of the first, second, and third semiconductor bodies is undoped or partially doped, and the diode junction is a PIN junction. In another example, the second source or drain region is on or otherwise merged with the first source or drain region. In some such cases, the diode junction is a PN junction. In another example, the integrated circuit includes a layer of undoped (or partially doped, as the case may be) semiconductor material between the first source or drain region and the second source or drain region, and the diode junction is provided at least in part by the first source or drain region, the layer of undoped or partially doped semiconductor material, and the second source or drain region. In some such cases, the diode junction is a PIN junction. Numerous variations and embodiments will be apparent in light of this disclosure.

General Overview

As previously noted above, there remain a number of non-trivial challenges with respect to stacked transistor architectures. For instance, diodes are employed to provide electrostatic discharge (ESD) protection for integrated circuit input/output (I/O) pins. Such diodes must be capable of sustaining relatively high current densities while imposing relatively low parasitic capacitance to avoid hampering the operation of the pin which they protect. Traditionally, these diodes have been formed by parasitic drain/source-body junctions. In more recent stacked transistor technologies which discard the source/drain-body junction by way of back-side isolation, substrate removal, or otherwise, such ESD diodes are not realizable. In the context of stacked configurations where such parasitic junctions are not present, one possible solution is to repurpose a transistor channel as a lateral diode. However, such a channel-based solution may suffer from increased capacitance due to the proximity of the transistor gate immediately adjacent to the anode and cathode terminals. In addition, transistors having area-constrained channel configurations (e.g., such as nanowire/ ribbon/sheet channels, relative to fin channels) will be susceptible to lower failure current, due to the decreased cross-sectional channel area.

Thus, and in accordance with an embodiment of the present disclosure, integrated circuits including vertical diodes are provided herein. In an example, a first and second transistors are arranged in a stacked configuration (e.g., the second transistor is above the first transistor). The first transistor includes a first semiconductor body extending laterally from a first source or drain region. The first source or drain region includes one of a p-type dopant or an n-type dopant. The second transistor includes a second semiconductor body extending laterally from a second source or drain region. The second source or drain region includes the other of the p-type dopant or the n-type dopant. The first source or drain region and second source or drain region, which are also referred to herein as diffusion regions, are at least part of a diode structure, which may have a PN junction or a PIN junction, depending on how the diffusion regions are coupled to form the diode.

In some embodiments, the second source or drain region is on or otherwise merged with the first source or drain region, so as to provide a PN junction. Note that this merging can be accomplished symmetrically, or asymmetrically from the N and P sides. In another embodiment, the first source or drain region and the second source or drain region are separated by an intrinsic (undoped or partially doped) semiconductor layer, so as to provide a PIN junction. Note that this semiconductor layer effectively provides a bridge between the upper and lower source or drain region, and can either be integrated with, or independent of, the upper and lower source or drain region forming processes. In another embodiment, the first source or drain region and the second source or drain region are separated by a dielectric layer and the first and second semiconductor bodies are part of the diode junction, so as to provide a PIN junction. In some such cases, the first and second semiconductor bodies are unreleased nanowires or nanoribbons or nanosheets, such that there is a third semiconductor body between and connected the first and second semiconductor bodies. In such cases, any or all of the first, second, and third semiconductor bodies can be undoped (or partially doped, as the case may be) to provide an intrinsic region of the PIN diode structure. Note that the first, second, and third semiconductor bodies may be, for instance, part of a multilayer fin, such as a fin including alternating layers of silicon and silicon germanium (SiGe), which can be used to provide silicon or SiGe nanowires, nanoribbons, or nanosheets, depending on the desired channel material. Other embodiments may use group III-V materials (e.g., alternating layers of gallium arsenide and indium gallium arsenide), or some other channel material. Further note that, prior to the source/ drain forming process, a gate spacer may be conformally deposited in a blanket fashion so as to also cover exposed sidewalls of fin portions where the source and drain regions will be formed, and thus can subsequently be used as a guide in not only the epitaxial source and drain formation process, but also in forming the intrinsic semiconductor layer or the dielectric layer that separates the first source or drain region and the second source or drain region.

A number of benefits arise when stacked transistor diffusions are joined to form the PN or PIN diode junctions as variously described herein. For instance, in the case of gate-all-around transistors, higher current carrying capability of the wider diode junctions (e.g., relative to solely relying on nanowire or ribbonized or other area-constrained channel pathways) allows for smaller IO area and higher performance, according to some embodiments. In addition, parasitic coupling from the transistor gate is avoided or otherwise reduced, according to some embodiments. Vertically forming a diode junction between upper and lower rows of transistor diffusion further allows standard transistor interconnects to serve as the anode and cathode connections, such that no special contact process is needed. Likewise, no major deviation from standard gate processing would be needed (e.g., gate-first or gate-last processes can be used). Moreover, the diode terminals can be readily separated to reduce parasitic coupling capacitance, such as in the example case where a frontside contact is used for one terminal, and a backside contact for the other terminal.

Although the techniques can be used with any number of planar and non-planar transistor topologies, they are particularly useful with respect to gate-all-around where a vertical diode junction would otherwise be area-constrained. The source and drain regions can be, for example, doped portions of a given fin or substrate, or epitaxial regions that are deposited during an etch-and-replace source/drain forming process. The dopant-type in the source and drain regions will depend on the polarity of the corresponding transistor (or diode). The gate structure can be implemented with a gate-first process or a gate-last process (sometimes called a remove metal gate, or RMG, process). Any number of semiconductor materials can be used in forming the transistors that will be used to provide the vertical diodes, such as group IV materials (e.g., silicon, germanium, silicon germanium) or group III-V materials (e.g., gallium arsenide, indium gallium arsenide).

According to an embodiment including nanowire or nanoribbon transistors formed from a multilayer fin structure, a cross-section parallel to and through the fin structure (perpendicular to the gate structure) will show merged or bridged diffusions between upper and lower transistors, or unreleased nanowire(s) or nanoribbon(s) or nanosheet(s) in the upper and lower transistor channel regions. Such features can be seen with cross-sectional imaging by, for example, a scanning electron microscopy or SEM, transmission electron microscopy or TEM, or other suitable inspection tool.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note the use of terms like "above" "below" "upper" "lower" "top" and "bottom" are simply used to facilitate discussion and are not intended to implicate a rigid structure or fixed orientation; rather such terms merely indicate spatial relationships when the structure is in a given orientation.

Architecture

FIG. 1a is a cross-sectional view that illustrates an example integrated circuit configured with one or more vertical diodes, in accordance with an embodiment of the present disclosure. The stacked configuration includes upper devices and lower devices, formed on the same fin structure. The fin structure is formed from a multilayer substrate 101 that includes alternating layers of semiconductor materials 101a (e.g., silicon) and 101b (e.g., SiGe). Any number of material systems can be used, and silicon and SiGe are just provided as examples. As can be seen, the cross-section is taken parallel to, and through, the fin structure, such that the channel, source, and drain regions are shown. This particular cross-section includes three channel regions along with a source region and a drain region in each of the upper and lower device regions, but any number of channel regions and corresponding source and drain regions can be included, as will be appreciated. Further note that all transistors shown in this example are contacted, but other examples may include dummy devices or devices that are not connected into the overall circuit. The semiconductor bodies 101a included in the channel regions of the upper and lower transistors can vary in form, but in this example embodiment are in the form of nanoribbons. In particular, the channel regions of the lower devices in this example case each include a first set of two nanoribbons 101a, and the channel regions of the upper devices each include a second set of two nanoribbons 101a above the corresponding first set. Other examples may include fewer nanoribbons 101a per channel region (e.g., one), or more nanoribbons 101a per channel region (e.g., three or four). Still other embodiments may include other channel configurations, such as one or more nanowires or a fin or other semiconductor body, including both planar and nonplanar topologies, although benefits of the techniques provided herein are particularly pronounced with respect to nanoribbon, nanowire, nanosheet, and other such area-constrained channel configurations. To this end, the present disclosure is not intended to be limited to any particular channel configuration or topology.

With further reference to FIG. 1a, the lower device region includes a source region 103a and a drain region 103b, each adjacent to and in contact with a channel region (nanoribbons 101a) on either side. Other embodiments may not have channel regions to each side, such as the example case where only the channel region between source region 103a and drain region 103b is present. As can be further seen in this example, the nanoribbons 101a are unreleased, in that semiconductor layers 101b of the multilayer fin structure have not been removed as normally done. As such, there is no gate structure wrapped around the nanoribbons 101a, in this example embodiment. Spacer 102 isolates semiconductor layers 101b from contacting source region 103a and drain region 103b. In other embodiments, there may be other insulator layers (e.g., interlayer dielectric) that prevent such contact, whether in addition to spacer 102, or in place of spacer 102. In addition, contacts 113 provide backside contact to source region 103a and drain region 103b, and interconnect 115 provides interconnection between contacts 113 and other parts of the integrated circuit.

The upper device region includes a source region 107a and a drain region 107b, each adjacent to and in contact with a channel region (nanoribbons 101a) on either side. Again, other embodiments may not have channel regions to each side, such as the example case where only the channel region between source region 107a and drain region 107b is present. As can be further seen in this example, the nanoribbons 101a are unreleased, in that semiconductor layers 101b of the multilayer fin structure have not been removed as normally done. As such, there is no gate structure wrapped around the nanoribbons 101a, in this example embodiment. Instead, there is a high-k metal gate (HKMG) or plug structure 108 on the uppermost nanoribbon 101. By using a standard HKMG 108 (except the nanoribbon release process is skipped), no or otherwise minimal deviation from standard gate processing is required, according to some embodiments. In such cases, note that the gate structure does not impart any meaningful performance benefit to the corresponding vertical diode; rather, such a gate is parasitic. In other embodiments, structure 108 may be, for example, a dielectric plug (e.g., silicon dioxide, or porous silicon dioxide). Such a plug 108 reduces the parasitic capacitance of the gate structure but will cause a greater deviation from standard gate processing, which is fine, according to some embodiments. A standard HKMG process is one in which, for example, dummy gate materials are removed from gate trench to expose channel region, sacrificial material 101b is removed to release nanoribbons 101a or vice-versa (skipped, according to an embodiment), a high-k gate dielectric is conformally deposited onto released nanoribbons 101a and/or exposed areas, and a gate electrode including workfunction material and possibly gate fill metal is then deposited on the gate dielectric. If the nanoribbons 101a are unreleased, then then gate structure materials deposit on the sides of the fin structure that includes both 101a and 101b, in a tri-gate fashion. Just as with the lower device region, spacer 102 isolates semiconductor layers 101b from contacting source region 107a and drain region 107b, and that previous discussion is equally applicable here. In addition, contacts 109 provide frontside contact to source region 107a and drain region 107b, and interconnect 111 provides interconnection between contacts 109 and other parts of the integrated circuit. Any number of interconnect schemes can be used.

As can further be seen in FIG. 1a, dielectric layer 105 prevents source region 103a from contacting source region 107a, and prevents drain region 103b from contacting drain region 107b. In particular, dielectric layer 105 includes dielectric material, and is on a top surface of each of source region 103a and drain region 103b. In addition, a bottom surface of each of source region 107a and drain region 107b is on a corresponding top surface of dielectric layer 105.

In this example embodiment, the junction of a first diode is provided by the interface between source region 103a and the nanoribbons 101a laterally extending therefrom, as well as the interface between source region 107a and the nanoribbons 101a laterally extending therefrom. In addition, intervening semiconductor layers 101b effectively connect the nanoribbons 101a of the upper and lower regions. To this end, the first diode junction is a PIN junction, wherein the nanoribbons 101 and semiconductor layers 101*b* are all undoped and provide a relatively thick intrinsic region between the doped source region 103*a* (e.g., p-doped) and the oppositely doped source region 107*a* (e.g., n-doped). In other example embodiments, the nanoribbons 101*a* may be doped (e.g., same dopant and concentration as the source or drain region from which they extend), and the relatively large thickness of semiconductor layer 101*b* that is between the upper and lower nanoribbons is undoped to provide a thinner intrinsic region of the PIN diode junction. To this end, partial doping can be used to vary the thickness of the intrinsic region. The junction of a second diode can be similarly provided by the interface between drain region 103*b* and the nanoribbons 101*a* laterally extending therefrom, as well as the interface between drain region 107*b* and the nanoribbons 101*a* laterally extending therefrom. In addition, intervening semiconductor layers 101*b* effectively connect the nanoribbons 101*a* of the upper and lower regions. Note that other embodiments may have just one diode, or more diodes (e.g., three, four, five, etc.). Further note that the "source" and "drain" labels are somewhat arbitrary, in that each such diffusion region can be similarly used in a vertical diode configuration as explained herein. To this end, there is no particular need to distinguish between source and drain regions, and they each can be more generally referred to as a "source or drain region" 103 or 107 (rather than designating one as a source region and the other as a drain region). The source or drain regions of a given vertical diode may also be referred to as lower and upper diffusion regions.

Each of HKMG structures 108 can be formed via gate-first or gate-last processing, and may include any number of suitable gate materials and configurations. In an embodiment, each of the structures 108 includes a gate electrode and a gate dielectric between the gate electrode and the uppermost semiconductor layer 101*a*. Note that only sides of the other underlying layers 101*a* and 101*b* within the gate trench will be exposed to the gate process, given that the nanoribbon release process is skipped, so as to allow the layers 101*b* to facilitate an intrinsic portion of the diode junction, according to an embodiment. Spacer 102 may also be considered part of the gate structures. Spacer 102 may be, for example, silicon nitride or oxynitride or oxycarbonitride. The gate dielectrics may be any suitable gate dielectric material(s), such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some example embodiments, an annealing process may be carried out to improve gate dielectric quality when a high-k material is used. Further, the gate electrodes may comprise a wide range of suitable metals or metal alloys, such as aluminum, tungsten, cobalt, ruthenium, molybdenum, titanium, tantalum, copper, titanium nitride, or tantalum nitride, for example.

In some embodiments, the gate dielectrics and/or gate electrodes may include a multilayer structure of two or more material layers or components. For instance, in one such embodiment, the gate dielectric can be a bi-layer structure having a first dielectric material (e.g., silicon dioxide) in contact with the uppermost layer 101*a* and a second high-k dielectric material (e.g., hafnium oxide) in contact with the first dielectric material. Likewise, the gate electrode may include a central metal plug or fill metal portion (e.g., tungsten, cobalt, molybdenum, ruthenium) with one or more outer workfunction layers (e.g., titanium nitride for PMOS workfunction, or an aluminum-containing alloy such as titanium aluminum carbide for NMOS workfunction) and/or barrier layers (e.g., tantalum nitride), and/or a resistance reducing cap layer (e.g., cobalt). In some embodiments, the gate dielectric and/or gate electrode may include concentration grading (increasing or decreasing) of one or more materials therein. Such gate processing is not particularly relevant to the diodes, but may be relevant to transistor structures being simultaneously formed in other locations of that the integrated circuit (e.g., logic area of device layer), and consistency of process across a given die may be helpful in avoiding diode-specific processes when possible. Numerous gate structure configurations can be used along with the techniques provided herein, and the present disclosure is not intended to be limited to any particular such configurations.

Likewise, numerous source and drain configurations can be used, and the present disclosure is not intended to be limited to any particular ones. In some example embodiments, the source regions 103*a* and 107*a* and drain regions 103*b* and 107*b* are epitaxial source and drain regions that are provided after the relevant portion of the fin was isolated and etched away or otherwise removed. In other embodiments, the source/drain regions may be doped portions of the fin or substrate, rather than epi regions. In some embodiments using an etch and replace process, the epi source regions 103*a* and 107*a* and epi drain regions 103*b* and 107*b* are faceted and overgrown from a trench within insulator material (e.g., shallow trench isolation, or gate spacer 102 that deposits on the sides of the fin structure in the source and drain locations), and the corresponding source or drain contact structure lands on that faceted portion. Alternatively, in other embodiments, the faceted portion of epi source and drain regions can be removed (e.g., via chemical mechanical planarization, or CMP), and the corresponding source or drain contact structure lands on that planarized portion.

The source regions 103*a* and 107*a* and drain regions 103*b* and 107*b* can be any suitable semiconductor material and may include any dopant scheme. For instance, source and drain regions 103 may be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions 107 can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, source and drain regions 103 are boron-doped SiGe, and source and drain regions 107 are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

The semiconductor bodies 101a, which in this case are nanoribbons, can be any number of semiconductor materials as well, such as group IV material (e.g., silicon, germanium, or SiGe) or group III-V materials (e.g., indium gallium arsenide). In other embodiments, the semiconductor bodies 101a may be fins on which the corresponding gate structures are formed to provide double-gate or tri-gate configurations (as opposed to gate-all-around configurations with nanoribbons or wires). The semiconductor bodies 101a may be doped, partially doped (e.g., such as the example case where a body 101a is doped at its ends but not in the middle portion), or undoped, and may be shaped or sculpted during the gate formation process, according to some embodiments. In some cases, semiconductor bodies 101a may be a multilayer structure, such as a SiGe body cladded with germanium, or a silicon body cladded with SiGe. Any number of channel configurations can be used. The semiconductor bodies 101b are compositionally different from semiconductor bodies 101a, so as to provide etch selectivity that may be useful in a release process (even those semiconductor bodies 101a are not released in this example embodiment), so as to facilitate release in another area of the integrated circuit (e.g., such as in the logic section of the device layer).

The contacts 109 and 113 can have any number of configurations. In some example embodiments, the contacts 109 and 113 include a contact metal and a conductive liner or barrier layer, deposited in a contact trench formed over the source and drain regions. The liner can be, for example, tantalum or tantalum nitride, and metal can be any suitable plug/core material, such as tungsten, aluminum, ruthenium, molybdenum, cobalt, titanium, copper, or alloys thereof. In some cases, the contacts 109 and 113 can be optimized p-type and n-type similar to p-type and n-type gate electrodes. For instance, according to some such embodiments, the liner can be titanium for NMOS source/drain contacts, or nickel or platinum for PMOS source/drain contacts. In still other embodiments, the contacts 109 and 113 may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. Further note that the bottommost layer 101a may be replaced with dielectric material, such that contacts 113 are formed in that dielectric material, during a backside contact process that includes removing the bottommost layer 101a. In a more general sense, any number of source/drain contact configurations and forming processes can be used, and the present disclosure is not intended to be limited to any particular such contact configurations or processes.

Interconnects 111 and 115 can also have many configurations, but generally include one or more dielectric layers (e.g., silicon dioxide) having conductive features (e.g., copper or aluminum vias, conductive runs, etc.) formed therein. Example interconnect configurations will be discussed in turn with reference to FIGS. 4a-b.

Figure 1B:
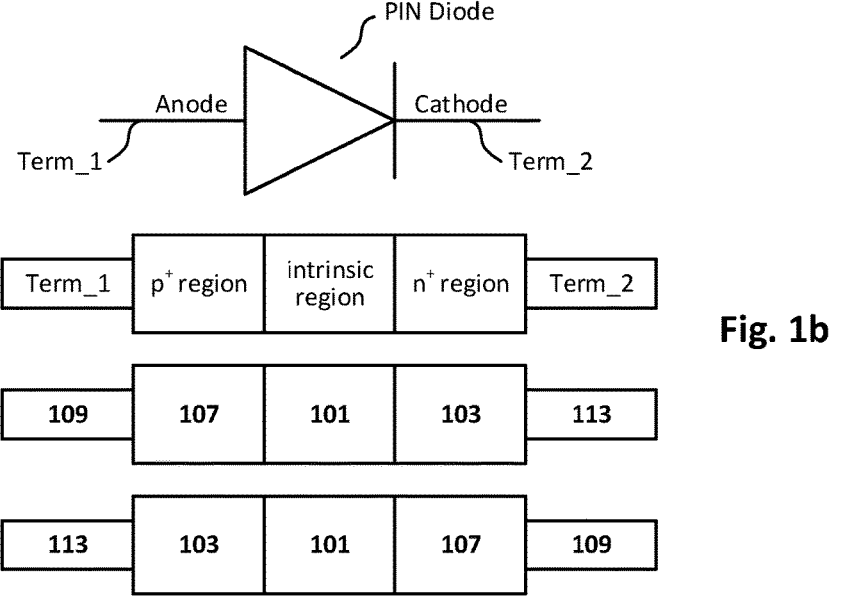
FIG. 1b schematically illustrates a vertical diode of the integrated circuit shown in FIG. 1a, in accordance with some such embodiments of the present disclosure.

FIG. 1b schematically illustrates a vertical PIN diode of the integrated circuit shown in FIG. 1a, in accordance with some embodiments. As can be seen, a PIN diode generally includes a PIN junction between a first terminal (Term_1) and a second terminal (Term_2). The PIN junction includes p-doped (p⁺) anode region separated from an n-doped (n⁺) cathode region by an undoped intrinsic region. So, and with further reference to FIG. 1a, note that the anode may be in one of the lower or upper device region, and the cathode is in the other of the lower or upper device region. In one such example case (middle of FIG. 1b), contact 109 provides Term_1, and source or drain region 107 provides the p-doped anode region. The intrinsic region is provided by the upper two layers 101a extending from source or drain region 107, along with the lower two layers 101a extending from source or drain region 103 and the intervening layers 101b. Recall that some of these layers 101a and/or 101b can be doped in a similar fashion to the source or drain region from which they extend, to change the thickness of the intrinsic region. In addition, source or drain region 103 provides the n-doped cathode region, and contact 113 provides Term_2. In another such example case (bottom of FIG. 1b), contact 113 provides Term_1, and source or drain region 103 provides the p-doped anode region. In addition, the lower two layers 101a extending from source or drain region 103 provide the intrinsic region, along the upper two layers 101a extending from source or drain region 107 and the intervening layers 101b. Again, some of these layers 101a and/or 101b can be doped in a similar fashion to the source or drain region from which they extend, to change the thickness of the intrinsic region. In addition, source or drain region 107 provides the n-doped cathode region, and contact 109 provides Term_2.

Figure 2A:
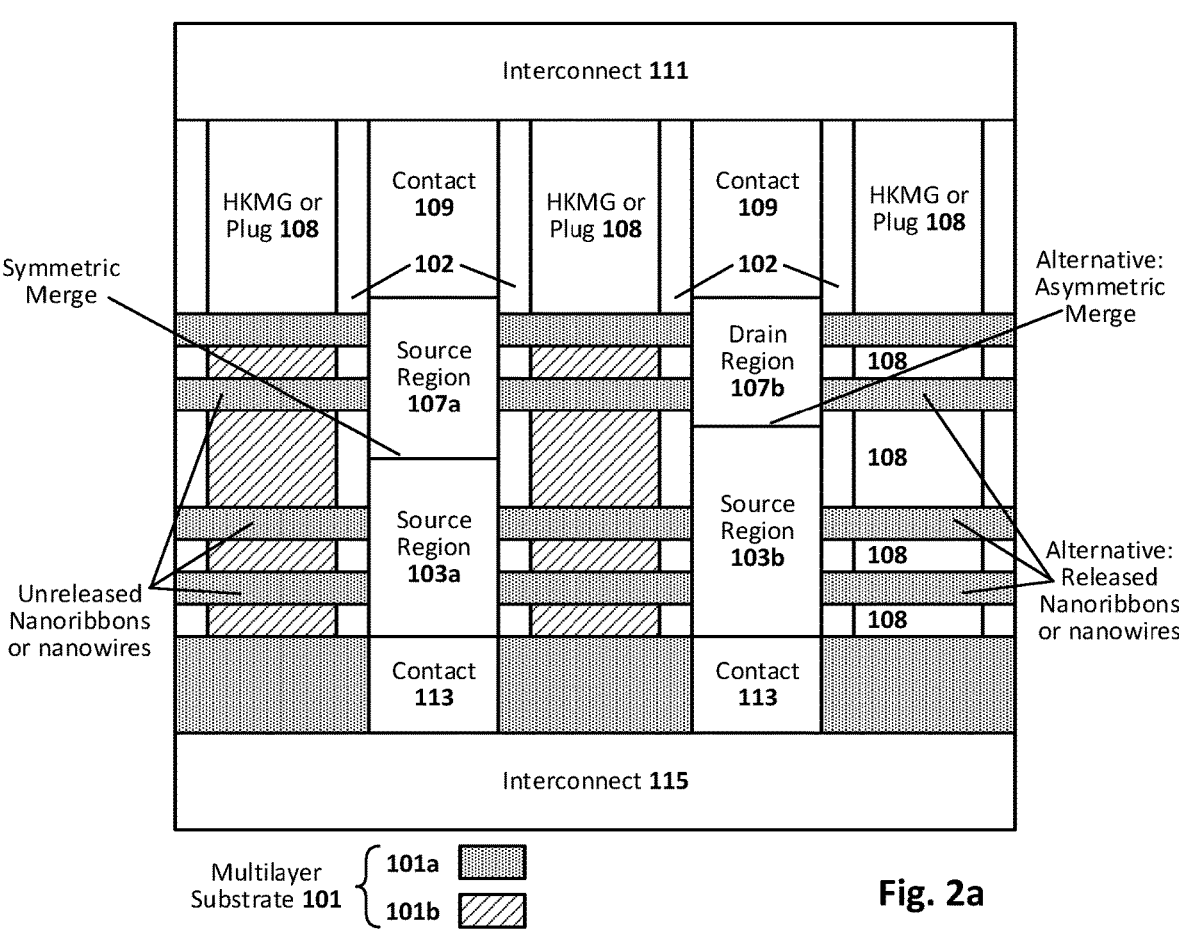
FIG. 2a is a cross-sectional view that illustrates another example integrated circuit configured with a vertical diode, in accordance with some embodiments of the present disclosure.

FIG. 2a is a cross-sectional view that illustrates another example integrated circuit configured with a vertical diode, in accordance with some embodiments of the present disclosure. As can be seen, this example is similar to the example of FIG. 1a, except that dielectric layer 105 is eliminated, and source region 107a is merged with source region 103a, and drain region 107b is merged with drain region 103b. Other differences and variations between FIGS. 1a and 2a will be discussed in turn. With respect to features that are similar between the example embodiments of FIGS. 1a and 2a, the previous relevant discussion is equally applicable here.

In this example of FIG. 2a, a junction of a first diode is provided by the interface between source region 103a (e.g., p-doped) and source region 107a e.g., n-doped). A second diode is similarly provided by the interface between drain region 103b and drain region 107b. Again, other embodiments may have just one diode, or more diodes (e.g., three, four, five, etc.), and the distinction between source and drain regions is not particularly important in this context. Here, the diode junction for each of the first and second diodes is a PN junction. Thus, the channel region provided by the nanoribbons 101 and semiconductor layers 101b can be considered extraneous, and in some embodiments may be removed, such as the case where layers 101a or 101b or both are removed within the channel region between spacer 102, during gate processing.

For instance, as can be seen in FIG. 2a, the far left and middle channel regions are left intact such that the nanoribbons 101a are unreleased, as previously explained. In such cases, structure 108 (e.g., whether a HKMG or dielectric plug) sits on the uppermost nanoribbon 101a (and possibly sidewalls of the multilayer fin structure), but does not extend further into the channel region. The channel region on the far right of FIG. 2a shows an alternative embodiment in which semiconductor layers 101b have been selectively removed from the channel region so as to release nanoribbons 101a. In such a case, note that a gate-all-around configuration can be provided, where a HKMG 108 wraps around each of the nanoribbons 101*a* within the channel region. In other such cases, a plug 108 (e.g., silicon dioxide, or a low-k dielectric such as porous silicon dioxide) can be deposited into the channel region rather than a HKMG, to provide isolation between neighboring diodes. In still other embodiments, nanoribbons 101*a* can also be removed from the channel region, such that plug 108 fills the entire channel region, to further improve isolation between neighboring diodes. Thus, while two nanoribbons 101*a* are shown in each channel region, other examples may include fewer nanoribbons 101*a* per channel region (e.g., one or zero), or more nanoribbons 101*a* per channel region (e.g., three or four). As previously explained, the bottommost layer 101*a* may be replaced with a dielectric material as well, such that contacts 113 are formed within recesses of that dielectric material.

As can further be seen in FIG. 2*a*, note that the merging of the lower (103) and upper (107) diffusion regions can be accomplished symmetrically, or asymmetrically. For instance, the leftmost PN junction (103*a*/107*a*) is an example of a symmetric merging in that each of 107*a* and 103*a* is about the same height, and the rightmost PN junction (103*b*/107*b*) is an example of an asymmetric merging in that diffusion 107*b* is shorter than diffusion 103*b* (in other such cases, diffusion 107*b* may be taller than diffusion 103*b*). The asymmetry can be used, for example, to tune diode performance for a given application. Note that such asymmetry can also be applied to the embodiment of FIG. 1*a*, in which dielectric layer 105 is between two diffusion regions, one of which is shorter than the other.

Figure 2B:
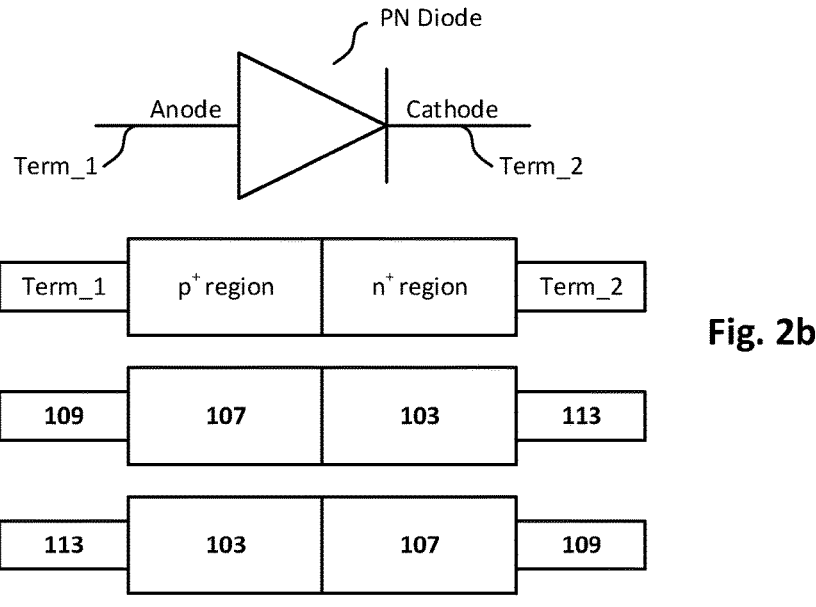
FIG. 2b schematically illustrates a vertical diode of the integrated circuit shown in FIG. 2a, in accordance with some such embodiments of the present disclosure.

FIG. 2*b* schematically illustrates a vertical PN diode of the integrated circuit shown in FIG. 2*a*, in accordance with some embodiments. As can be seen, a PN diode generally includes a PN junction between a first terminal (Term_1) and a second terminal (Term_2). The PN junction includes p-doped (p⁺) anode region abutted to an n-doped (n⁺) cathode region. So, and with further reference to FIG. 2*a*, note that the anode may be in one of the lower or upper device region, and the cathode is in the other of the lower or upper device region. In one such example case as shown in the middle of FIG. 2*b*, contact 109 provides Term_1, source or drain region 107 provides the p-doped anode region, source or drain region 103 provides the n-doped cathode region, and contact 113 provides Term_2. In another such example case as shown at the bottom of FIG. 2*b*, contact 113 provides Term_1, source or drain region 103 provides the p-doped anode region, source or drain region 107 provides the n-doped cathode region, and contact 109 provides Term_2.

Figure 3A:
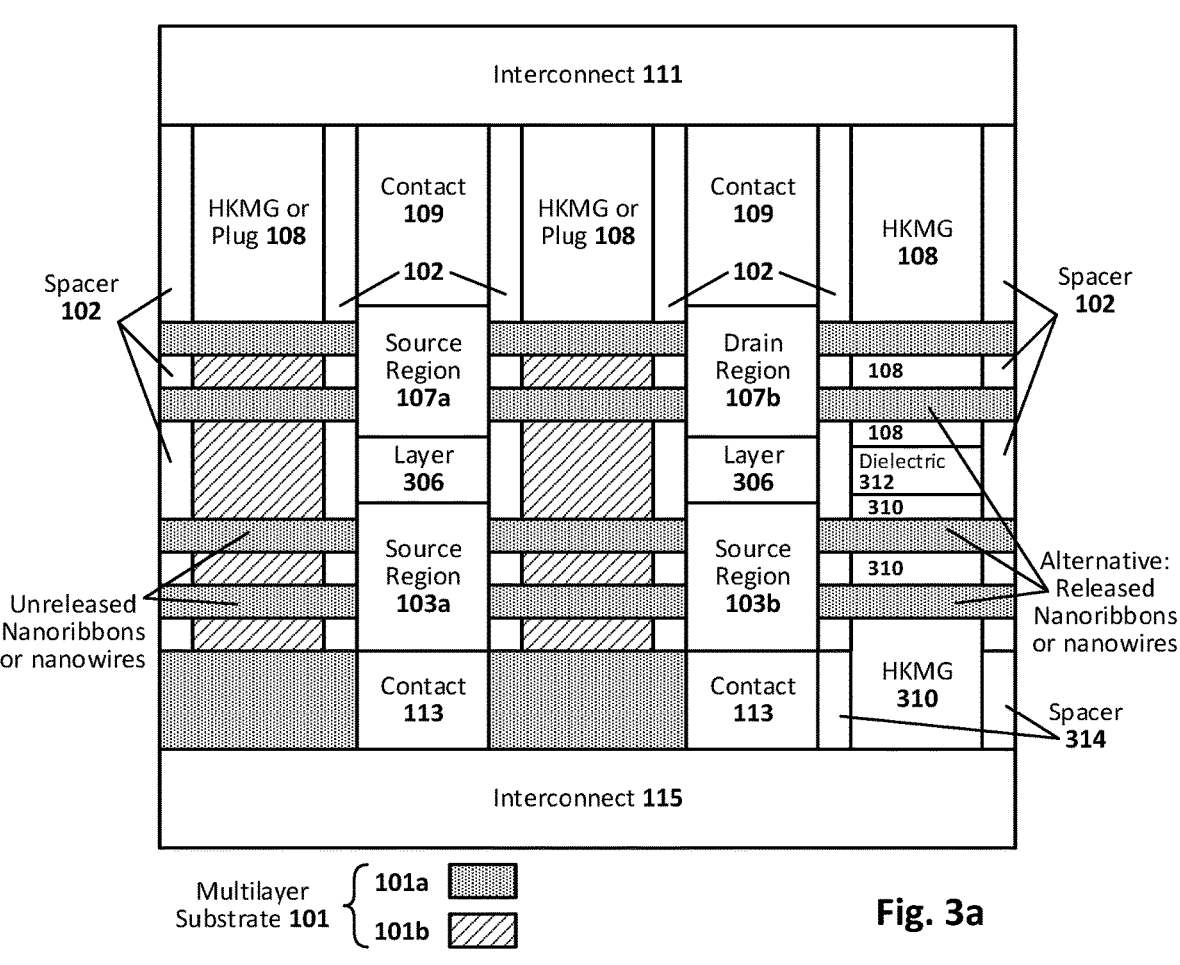
FIG. 3a is a cross-sectional view that illustrates another example integrated circuit configured with a vertical diode, in accordance with some embodiments of the present disclosure.

FIG. 3*a* is a cross-sectional view that illustrates another example integrated circuit configured with a vertical diode, in accordance with some embodiments of the present disclosure. As can be seen, this example is similar to the example of FIG. 1*a*, except that dielectric layer 105 has been replaced with a semiconductor layer 306, so as to provide an intrinsic region or bridge between source region 107*a* and source region 103*a*, as well as between drain region 107*b* and drain region 103*b*. Other differences and variations between FIGS. 1*a* and 3*a* will be discussed in turn. With respect to features that are similar between the example embodiments of FIGS. 1*a*, 2*a*, and 3*a*, the previous relevant discussion is equally applicable here.

In this example embodiment of FIG. 3*a*, the junction of a first diode is provided by the interface between the top surface of source region 103*a* and the bottom surface of semiconductor layer 306, as well as the interface between the bottom surface of source region 107*a* and the top surface of semiconductor layer 306. To this end, the first diode junction is a PIN junction, wherein semiconductor layer 306 provides a relatively thick intrinsic region between the doped source region 103*a* (e.g., p-doped) and the oppositely doped source region 107*a* (e.g., n-doped). Note that layer 306 can be partially doped, to change the thickness of the intrinsic region of the PIN diode. For instance, in one example case, a top portion of 306 is doped similar to diffusion region 107*a* and a bottom portion of 306 is undoped; in another example case, a top portion of 306 is undoped and a bottom portion is doped similar to diffusion region 103*a*; in another example case, a top portion of 306 is doped similar to diffusion region 107*a*, a middle portion of 306 is undoped, and a bottom portion is doped similar to diffusion region 103*a*. The junction of a second diode can be similarly provided by the interface between the top surface of drain region 103*b* and the bottom surface of semiconductor layer 306, as well as the interface between the bottom surface of drain region 107*b* and the top surface of semiconductor layer 306. Note that other embodiments may have just one diode, or more diodes (e.g., three, four, five, etc.). Given the presence of semiconductor layer 306, the nanoribbons 101 and semiconductor layers 101*b* extending laterally from the diffusion regions 103 and 107 can be considered extraneous, and in some embodiments may be removed, such as the case where layers 101*a* or 101*b* or both are removed within the channel region between spacer 102, during gate processing.

For instance, as can be seen in FIG. 3*a*, the far left and middle channel regions are left intact such that the nanoribbons 101*a* are unreleased, and structure 108 sits on the uppermost nanoribbon 101*a* (and possibly sidewalls of the multilayer fin structure) but does not extend further into the channel region, as previously explained. The channel region on the far right of FIG. 3*a* shows an alternative embodiment in which semiconductor layers 101*b* have been selectively removed from the channel region so as to release nanoribbons 101*a*. In such a case, note that a gate-all-around configuration can be provided. In particular, in this example case, a first gate structure (HKMG 108) wraps around each of the nanoribbons 101*a* within the upper channel region, and a second gate structure (HKMG 310) wraps around each of the nanoribbons 101*a* within the lower channel region. An isolation structure 312 separates the first and second gate structures. As previously explained, even though the gate structures are not particularly helpful with respect to the diode performance, including them allows standard gate processing to be carried out with little or no special processing in the vertical diode section of the integrated circuit. In one such example, HKMG 108 is provided by way of frontside processing, and HKMG 310 is provided by way of backside processing. Any number of gate processing schemes can be used.

Note that such asymmetry of the example embodiment of FIG. 2*a* can also be applied to the embodiment of FIG. 3*a*, in which semiconductor layer 306 is between two diffusion regions, one of which is shorter than the other.

Figure 3B:
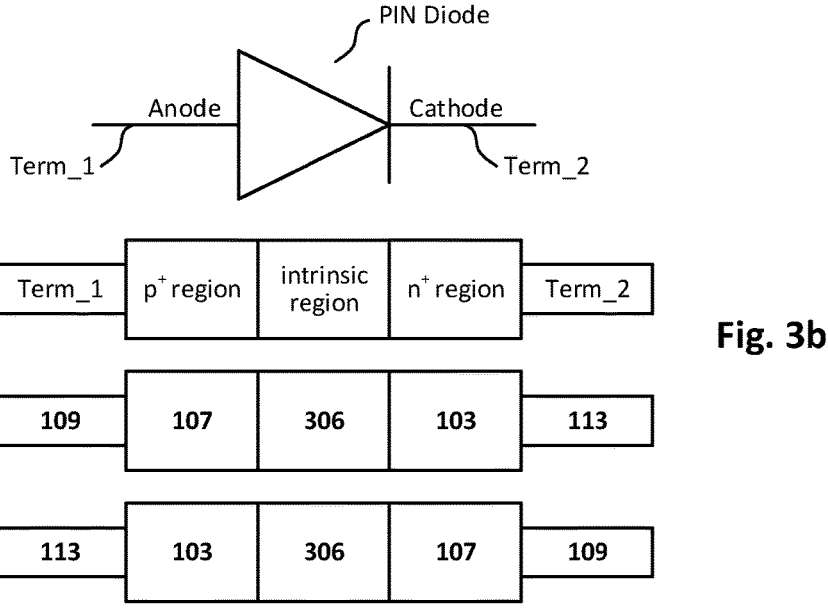
FIG. 3b schematically illustrates a vertical diode of the integrated circuit shown in FIG. 3a, in accordance with some such embodiments of the present disclosure.

FIG. 3*b* schematically illustrates a vertical PIN diode of the integrated circuit shown in FIG. 3*a*, in accordance with some embodiments. As can be seen, a PIN diode generally includes a PIN junction between a first terminal (Term_1) and a second terminal (Term_2). The PIN junction includes p-doped (p⁺) anode region separated from an n-doped (n⁺) cathode region by an undoped intrinsic region. So, and with further reference to FIG. 3*a*, note that the anode may be in one of the lower or upper device region, and the cathode is in the other of the lower or upper device region. In one such example case (middle of FIG. 3*b*), contact 109 provides Term_1, and source or drain region 107 provides the p-doped anode region. The intrinsic region is provided by semiconductor layer 306. In addition, source or drain region 103 provides the n-doped cathode region, and contact 113 provides Term_2. In another such example case (bottom of FIG. 3b), contact 113 provides Term_1, and source or drain region 103 provides the p-doped anode region. In addition, semiconductor layer 306 provides the intrinsic region. In addition, source or drain region 107 provides the n-doped cathode region, and contact 109 provides Term_2. Recall that layer 306 can be left undoped, or partially doped to provide other intrinsic region thicknesses.

Figure 4A:
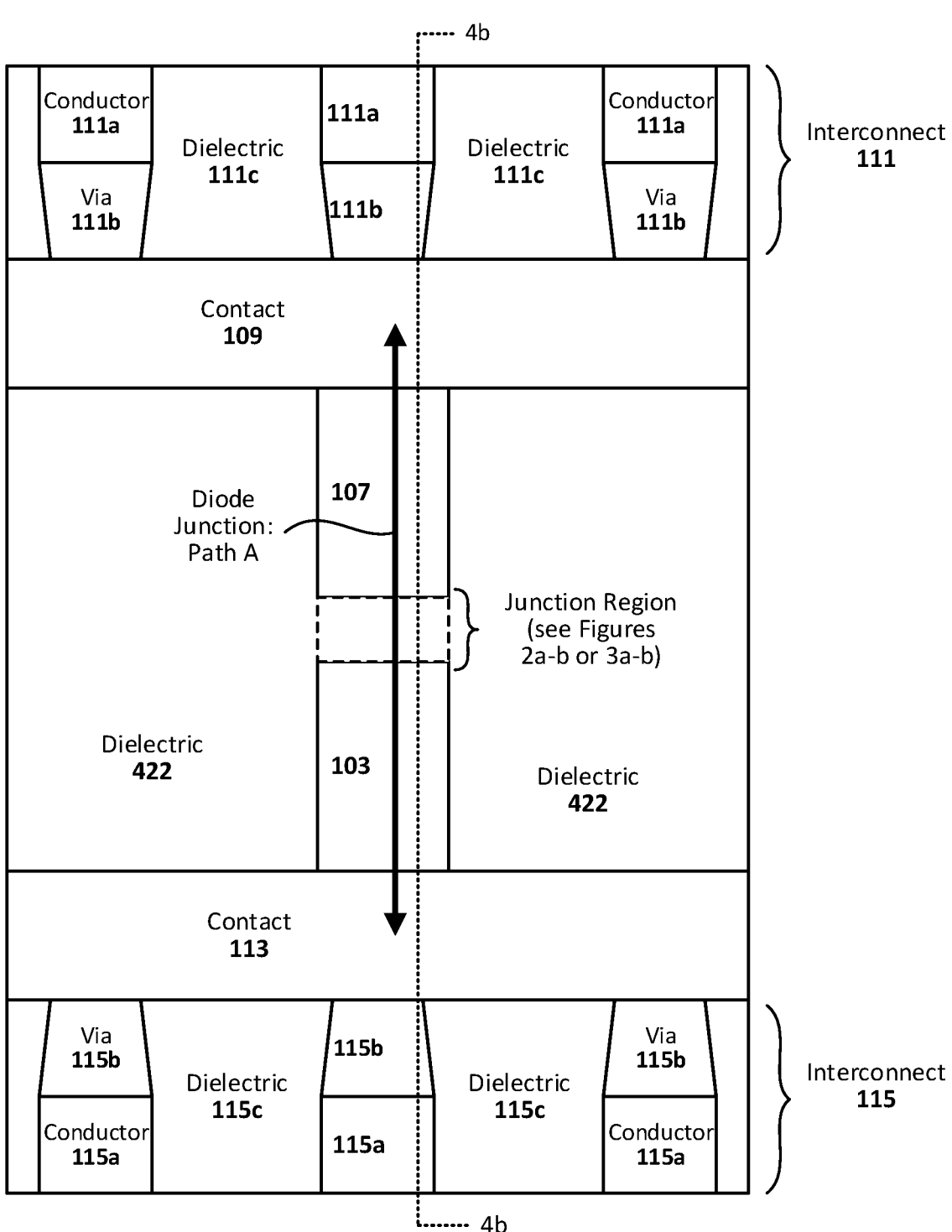
FIGS. 4a-b are cross-sectional views (orthogonal to one another) that illustrate further details with respect to frontside and backside interconnects of an example integrated circuit configured with a vertical diode, in accordance with some embodiments of the present disclosure.
Figure 4B:
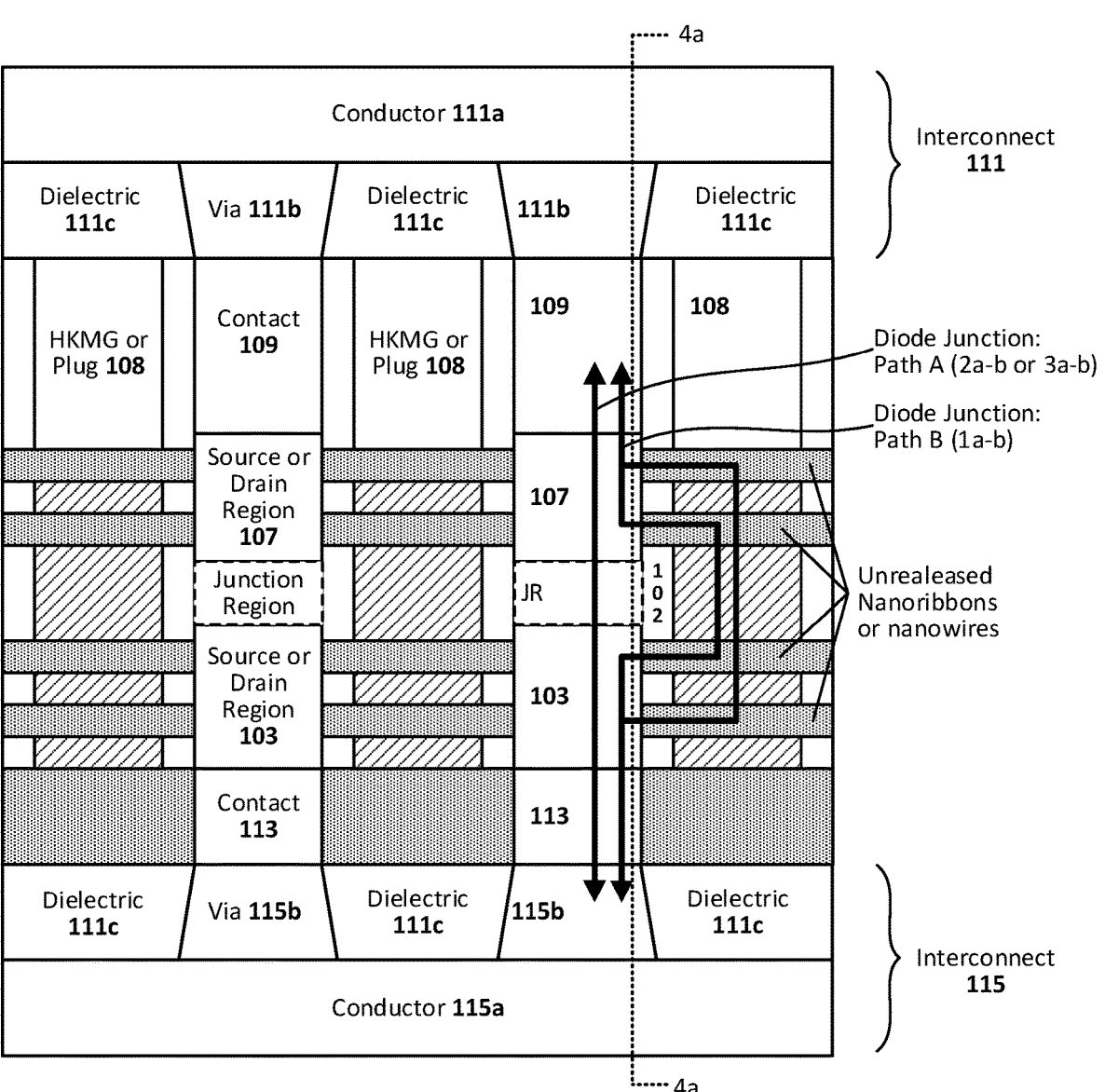

FIGS. 4a-b are cross-sectional views (orthogonal to one another) that illustrate further details with respect to frontside and backside interconnects of an example integrated circuit configured with a vertical diode, in accordance with some embodiments of the present disclosure. The cross-section of FIG. 4a is perpendicular to the fin structure, and through the upper 107 and lower 103 diffusion regions (dashed line 4a-4a in FIG. 4b). As can further be seen, the diode junction may be a PIN junction (FIGS. 1a-b and 3a-b) or a PN junction (FIGS. 2a-b), and the relevant previous discussion is equally applicable here. The diode junction path A (shown with a bold line) refers to the embodiment where the upper and lower diffusions are merged with one another to provide a PN junction (FIGS. 2a-b), or alternatively, the embodiment where the upper and lower diffusions are separated from one another by an undoped (or partially doped, as the case may be) semiconductor layer to provide a PIN junction (FIGS. 3a-b).

As can be further seen in FIG. 4a, contact 109 extends laterally across the top of diffusion region 107, which effectively allows interconnect 111 to provide multiple connection points to the upper diffusion region 107. In this example case, interconnect 111 includes multiple vias 111b formed in dielectric layer 111c, with each via 111b in contact with a corresponding conductor 111a. Each via is on contact 109. Such a interconnect scheme can be provisioned during frontside interconnect processing. In a similar fashion, contact 113 extends laterally across the bottom of diffusion region 103, which effectively allows interconnect 115 to provide multiple connection points to the lower diffusion region 103. In this example case, interconnect 115 includes multiple vias 115b formed in dielectric layer 115c, with each via 115b in contact with a corresponding conductor 115a. Each via is on contact 113. Such a interconnect scheme can be provisioned during backside interconnect processing.

The cross-section of FIG. 4b is parallel to, and through, the fin structure (dashed line 4b-4b in FIG. 4a). Note conductor 111a extends along the top of vias 111b, and conductor 115a extends along the bottom of vias 115b, in this example. As previously explained, diode junction path A (shown with a first bold line) refers to example PN and PIN junctions of FIGS. 2a-b and 3a-b, respectively. As can further be seen in FIG. 4b, diode junction path B (shown with a second bold line) refers to the embodiment where the upper and lower diffusions are separated from one another by a dielectric layer 105, and an intrinsic diode region is provided by the unreleased nanoribbons (or other semiconductor body) in the adjacent channel region, to provide a PIN junction. As previously explained, doping can be used to tune the thickness of the intrinsic region.

Methodology

Figure 5A:
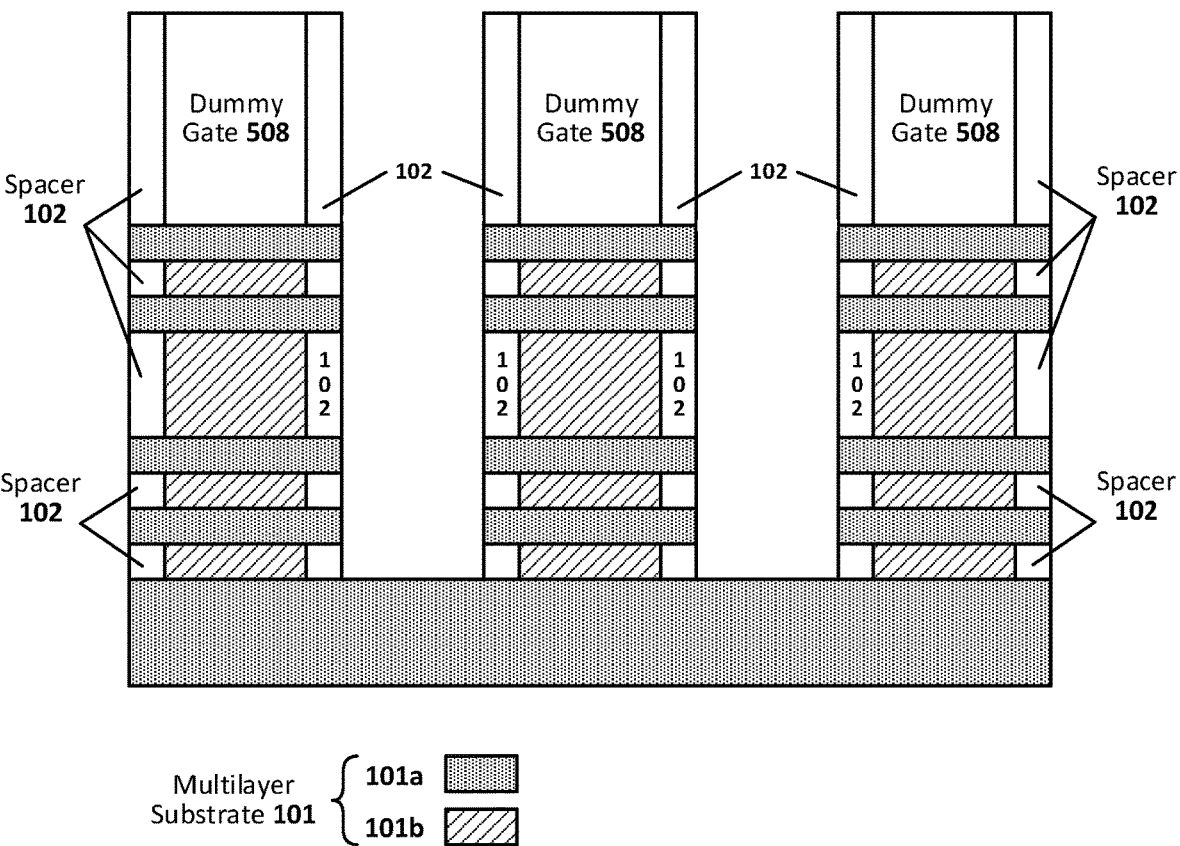
FIGS. 5a-5e are cross-sectional views that collectively illustrate an example process for forming an integrated circuit configured with vertical diodes, in accordance with some embodiments of the present disclosure.

FIGS. 5a-5e are cross-sectional views that collectively illustrate an example process for forming an integrated circuit configured with vertical diodes, in accordance with some embodiments of the present disclosure. As can be seen in FIG. 5a, the integrated circuit includes a multilayer fin structure formed from a multilayer substrate 101. The cross-section is taken parallel to, and through, the fin structure. The multilayer substrate generally includes alternating layers of semiconductor materials 101a and 101b. In an embodiment, layers 101a are silicon layers, and layers 101b are SiGe layers. Such a configuration is particularly useful in forming nanoribbons or nanowires or nanosheets, given the etch selectivity between silicon and SiGe. The fins can be formed using any number of fin forming processes. In addition, dummy gate structures 508 have been formed over the fin structure (the gate structures are orthogonal to the fin structures). In this example case, three gate structures are shown, but any number of gate structures can be used. The dummy gate structures may include, for instance, a dummy gate dielectric (e.g., oxide native to the fin structure) and polysilicon. Spacer 102 is provided on the sides of the gate structures and laterally adjacent layers 101b. In one example case, the upper most portion of spacer 102 (adjacent the dummy gate 508) is provided directly on the side of the gate structures, via a conformal deposition process. Note that process will also provide a similar conformal spacer on sidewalls of the fin structure, and that spacer can be used as a guide when forming epitaxial diffusion regions. The lower portion of spacer 102 can be provided during the source and drain processing.

In more detail, and as can be further seen in FIG. 5a, the portions of the fin structure where the source and drain regions (or diffusion regions) will be provided have been etched away or otherwise removed. At this point, layers 101b can be selectively recessed in the lateral direction (e.g., by an isotropic etch within the source and drain recesses, the etch being selective to layers 101a), and then the lower portion of spacer 102 is conformally deposited (e.g., atomic layer deposition, ALD) within the recesses, so as to provide spacer material between layers 101a. Any excess spacer material deposited within the recesses can be removed, for instance, via a directional etch (e.g., anisotropic dry etch), so as to provide the example structure shown in FIG. 5a. In some embodiments, after layers 101b are recessed and before spacer 102 is deposited into the recesses, a dopant can be applied to the exposed ends of layers 101a. Such doping can be used to partially dope layers 101a to decrease the thickness of the intrinsic region provided by the central portion of 101a between the oppositely-doped diffusion regions to be subsequently formed. The doping process can be timed to control the depth of the doping along the layer 101a, so as to partially dope that layer (shorter duration) or completely dope that layer (longer duration). The dopant can be, for instance, the same dopant (whether p-type or n-type) as will be provided in the diffusion region to be subsequently formed in that recess as shown in FIG. 5b.

Figure 5B:
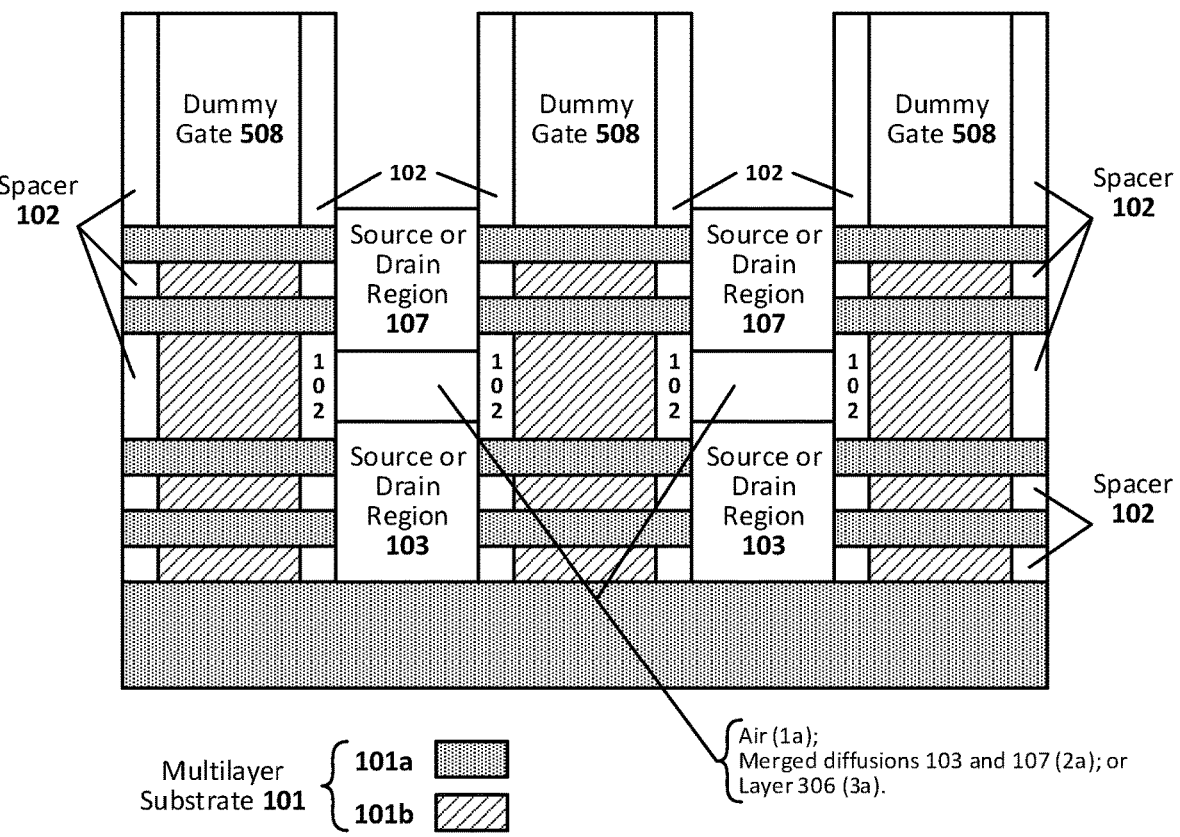

FIG. 5b shows the structure of FIG. 5a, after upper source and drain regions 107 and lower source and drain regions 103 have been formed, according to an embodiment. The source/drain deposition process can be carried out in a number of ways, but in some examples is achieved using blocking masks so that the source/drain materials can be selectively deposited, as will be explained in turn with reference to FIGS. 6 through 10c. Other embodiments may use a sequential bottom-up deposition and etch-back process, where lower source or drain materials are first deposited in the recesses, followed by a recess etch to remove any such materials from the upper portion of the recesses, followed by deposition and etch-back of any intervening layer (e.g., 105 or 306) if any, followed by deposition and etch-back of upper source or drain materials. In a more general sense, any number of forming techniques can be used to provision the source and drain regions 103 and 107.

In one example case, the lower source or drain regions 103 are epitaxially grown from the lower layers 101*a* exposed within the lower portion of the recesses. The lower source or drain regions 103 may be p-doped semiconductor material (to provide an anode region) or n-doped semiconductor (to provide a cathode region). In a similar fashion, the upper source or drain regions 107 are epitaxially grown from the upper layers 101*a* exposed within the upper portion of the recesses. The upper source or drain regions 107 are oppositely doped with respect to the lower source or drain regions 103 so as to provide the other of the cathode region or the anode region. Note that the resulting structure may vary, depending on the embodiment being formed. For instance, if the example structure of FIG. 1*a* is being formed, then there may be an air gap between the diffusions region 103 and 107, which will subsequently be filled with dielectric material to provide layer 105. Alternatively, if the example structure of FIG. 2*a* is being formed, then diffusion region 107 is grown until it merges with the underlying diffusion region 103. Alternatively, if the example structure of FIG. 3*a* is being formed, then layer 306 is grown on top of the underlying diffusion region 103. In any such cases, further note that each epitaxial deposition can be timed, so as to provide the desired degree of symmetry (or asymmetry).

Figure 5C:
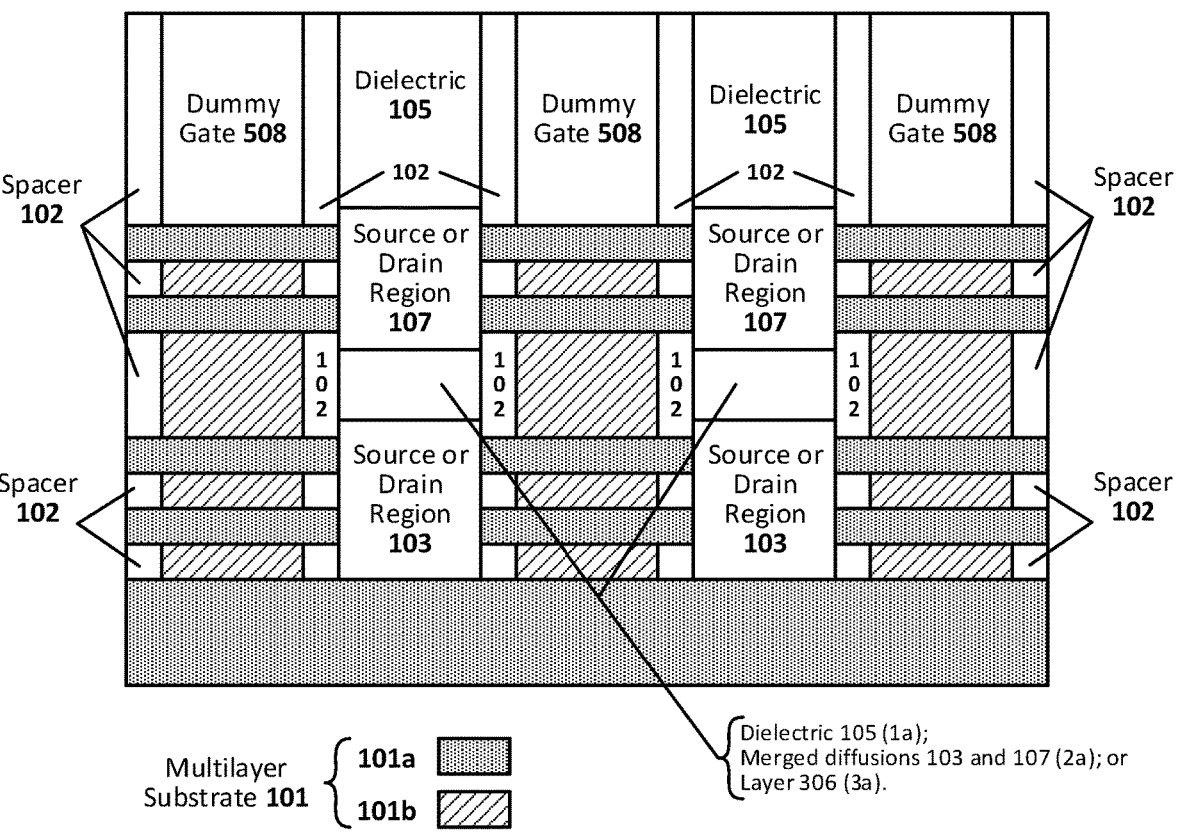

FIG. 5*c* shows the structure of FIG. 5*b*, after dielectric 105 has been deposited to fill the remaining portion of the source and drain recesses, according to an embodiment. In addition, with respect to the example case of FIG. 1*a*, the dielectric 105 also fills the air gap between the lower 103 and upper 107 diffusion regions.

Figure 5D:
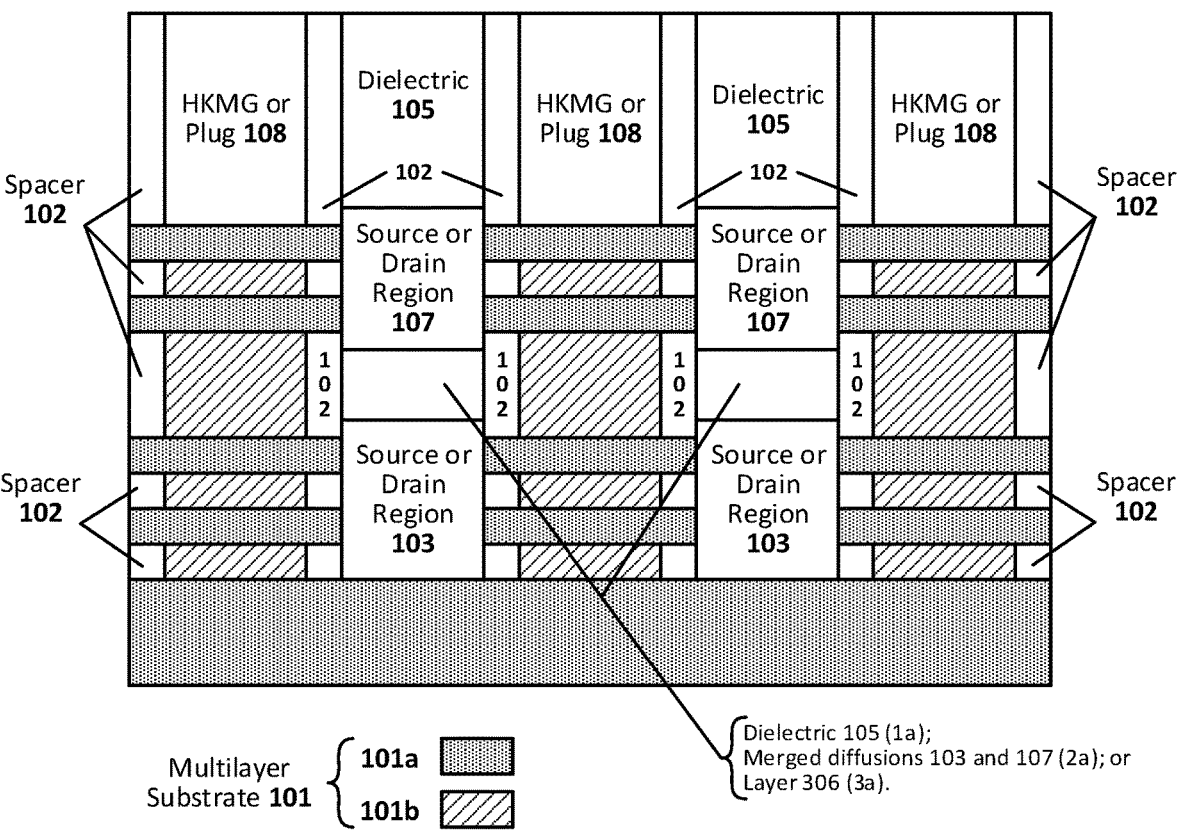

FIG. 5*d* shows the structure of FIG. 5*c*, after the dummy gates 508 have been removed and HKMG or plug structures 108 are formed in their place, according to an embodiment. As previously explained, note that such gate processing can be part of a standard wafer-wide gate process, so as to not require additional processing. Further note that once the dummy gates 508 are removed, the exposed channel regions can be manipulated as desired (e.g., shaped, release of nanoribbons or wires, remove one or more nanoribbons or wires in a depopulation process, cladded, or some other channel processing). In some embodiments such as that shown in FIG. 1*a*, recall that layers 101*b* are not selectively removed so that they can assist in providing a diode junction that is not as size-constrained as a diode junction of just nanoribbons or wires. In other embodiments, layers 101*a* and/or 101*b* can be removed, as discussed with reference to the example alternative embodiments on the right sides of FIGS. 2*a* and 3*a*.

Figure 5E:
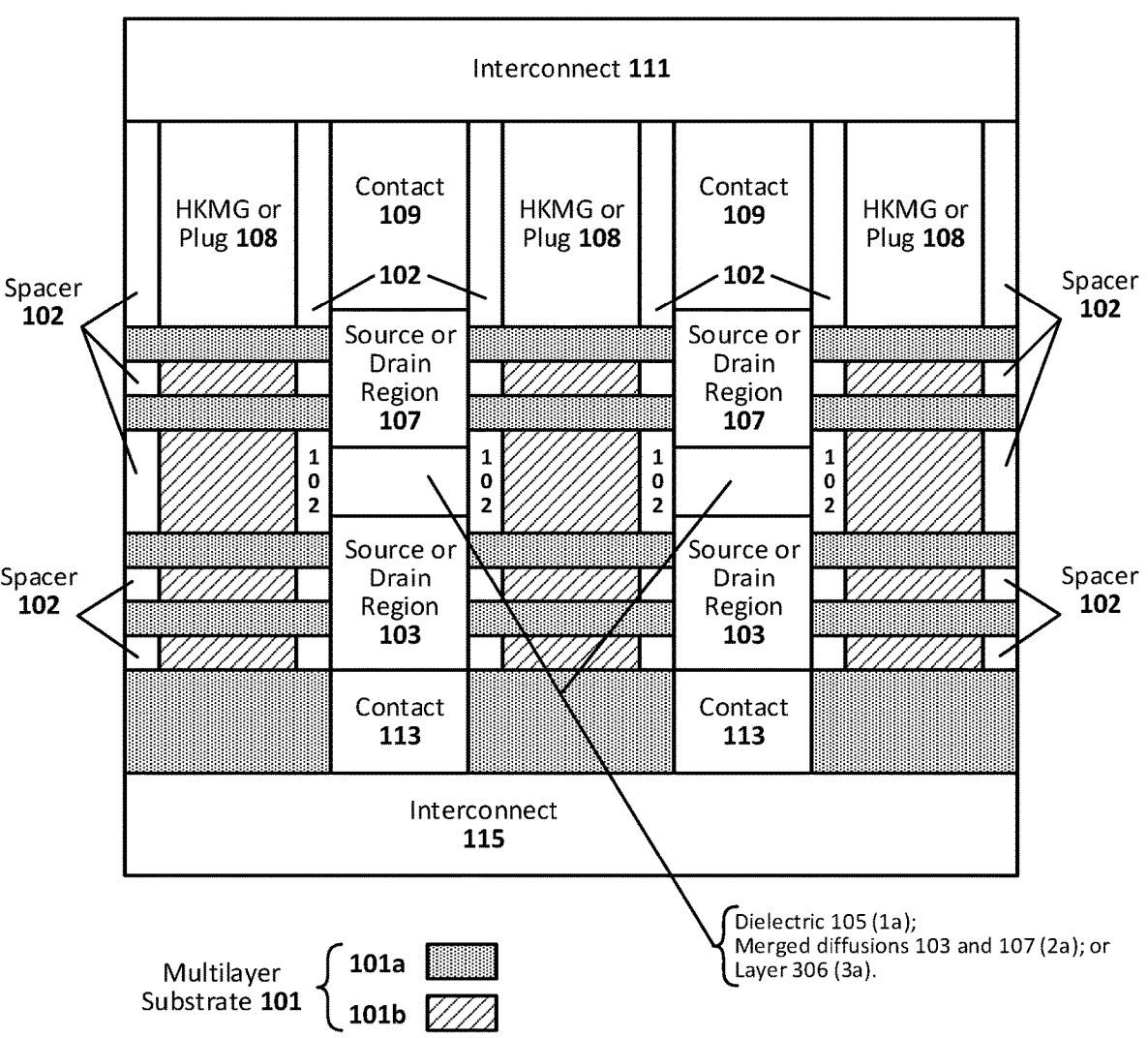

FIG. 5*e* shows the structure of FIG. 5*d*, after contacts 109 and interconnect 111 have been formed in frontside processing operations, and after contacts 113 and interconnect 115 have been formed in backside processing operations, according to an embodiment. Recall that the lowermost layer 101*a* may be removed during backside processing and replaced with a dielectric layer, in which contacts 113 may be formed. Any number of contact and interconnect processes can be used.

FIG. 6 illustrates an example method for forming an integrated circuit configured with vertical diodes, in accordance with an embodiment of the present disclosure. This method can be used, for instance, to form the example structures shown in FIGS. 1*a*, 2*a*, and 3*a*, although other structures will be apparent in light of this disclosure. The method includes forming 602 a number of multilayer fins, which can be accomplished, for instance, by patterning a multilayer substrate and etching it to form multilayer fins. Multilayer fins are particularly useful when forming nanoribbon devices or other gate-all-around devices. Other embodiments may include single layer fins to provide devices having tri-gate or other fin-based channel regions. The method continues with forming 604 a number of dummy gate structures over the fins. Standard dummy gate processing can be used. As previously explained, the dummy gate structure(s) may include a gate spacer that also deposits on sidewalls of the multilayer fin(s), and that gate spacer can be used to constrain epitaxial growth of diffusion regions. The method continues with recessing 606 the source and drain regions (also referred to herein as diffusion regions), to each side of a given gate structure. Standard lithography masking and etching can be used to form the source/drain recesses.

The method continues with laterally recessing 608 sacrificial layers (e.g., 101*b*) of the multilayer fin with etch that is selective to channel layers (e.g., 101*a*) of the multilayer fin. In one example case where the multilayer fin includes alternating layers of silicon and SiGe, an etch that is selective to the silicon layer is used to recess the SiGe layers. The depth of the recess can vary from one embodiment to the next, but in some cases is in the range of 2 to 10 nanometers (nm). In an embodiment, the recess is carried out via an isotropic wet etch. The method continues with forming 610 spacer material into the recesses, so as to provide spacer material between channel layers of the multilayer fin. Note this spacer material can be, for example, the same spacer material (e.g., a nitride, such as silicon nitride, silicon oxy nitride, or silicon oxycarbonitride) as the gate spacer used when forming the dummy gate structure at 604. A conformal deposition process can be used to deposit the spacer, such as chemical vapor deposition (CVD) or ALD.

The method continues with forming 612 the lower and upper source and drain regions. As previously explained, such forming can be accomplished, for instance, by way of selective epitaxial deposition and etch-back processes where needed. Blocking masks may also be used to increase selectivity of deposition, as will be further discussed with reference to FIG. 7. The method continues depositing 614 dielectric (e.g., oxide, such as silicon dioxide) to fill any remaining portion of the source and drain recesses. Chemical mechanical polish (CMP) processing can be used to planarize the resulting structure and remove extraneous materials from the top of the structure.

The method continues with removing 616 the dummy gate structure(s) and forming the final gate structures. So, for instance, polysilicon dummy gate material can be removed from between silicon nitride gate spacers to expose the underlying channel region. At this point, some embodiments may include releasing a number of nanoribbons or other semiconductor bodies within the exposed channel region, by we of a selective etch. Channel shaping and depopulation (e.g., removal of one or more nanowires or ribbons) may also be carried out. In other embodiments, no release processing is performed, so as to maintain a bulky channel region that can provide an intrinsic region of the vertical diode being formed (e.g., FIG. 1*a*). Thus, the final gate structure will vary depending on the embodiment being formed. In any case, if present, the final gate structure may include standard features of a gate structure (e.g., high-k gate dielectric such a hafnium oxide, workfunction layer such as titanium nitride for p-type gates or titanium aluminum carbide for n-type gates, and fill metal such as tungsten). In other embodiments, a dielectric plug (e.g., any oxide, nitride, carbide, or combination thereof) is formed, instead of a final gate structure.

The method continues with forming 618 frontside contacts and interconnect, and forming 620 backside contacts and interconnect, such as discussed with reference to the example embodiments of FIG. 4a-b. Any number of frontside and/or backside contact and interconnect schemes can be used.

Figure 7:
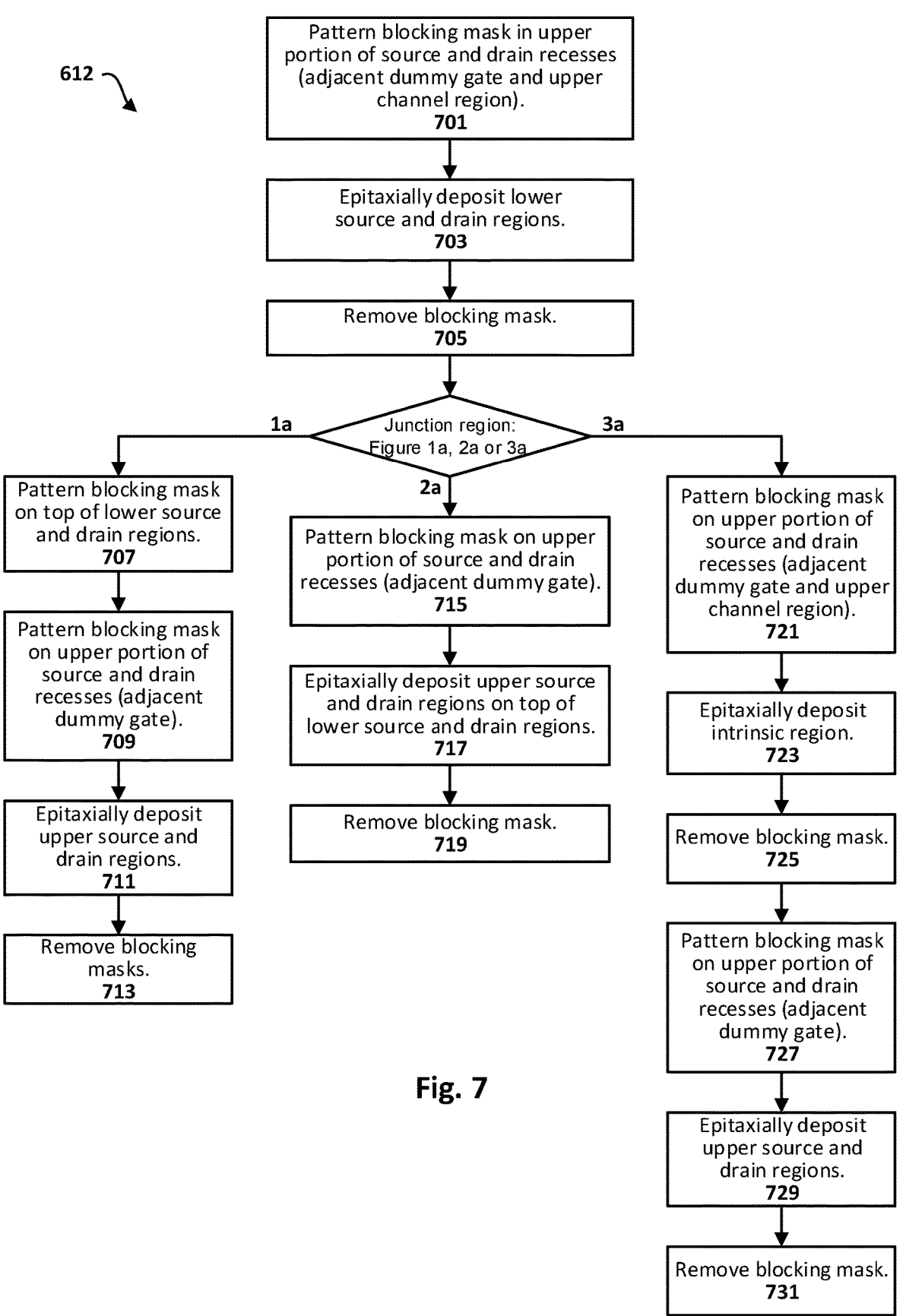
FIG. 7 illustrates an example method for forming lower and upper source and drain regions for an integrated circuit including vertical diodes, in accordance with an embodiment of the present disclosure.

FIG. 7 illustrates an example method for forming lower and upper source and drain regions integrated circuit configured with vertical diodes, in accordance with an embodiment of the present disclosure. This methodology can be used, for instance, at 612 of the method shown in FIG. 6. As can be seen, the method can vary depending on the diode junction being formed, whether it be the PIN junction of FIG. 1a, the PN junction of FIG. 2a, or the PIN junction of FIG. 3a. FIGS. 8a-10c show a number of cross-section views of structures that are used to help describe the methodology. The cross-sections are taken parallel to, and through, the fin structure.

Figure 8A:
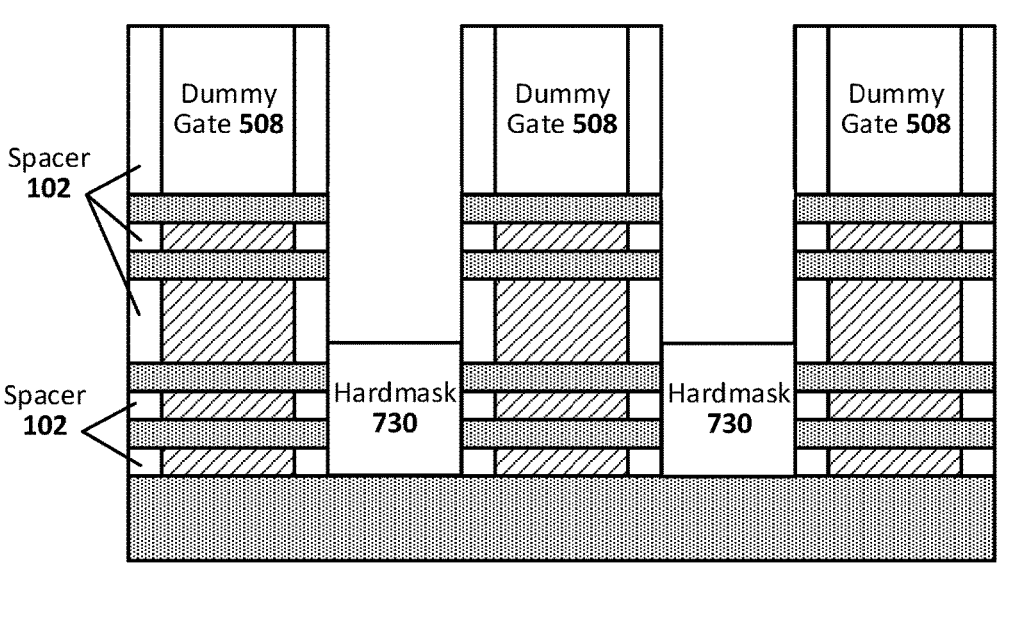
Figure 8B:
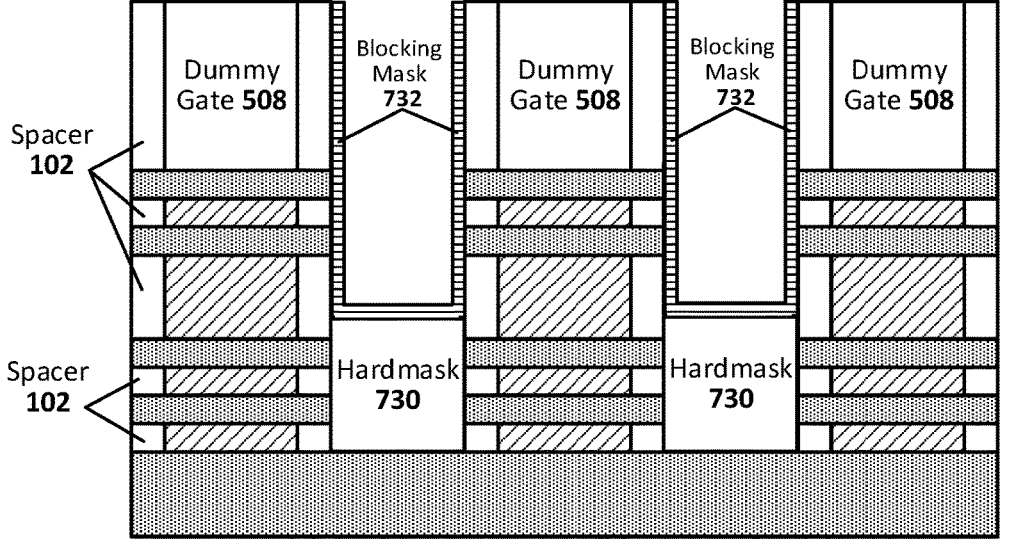
Figure 8C:
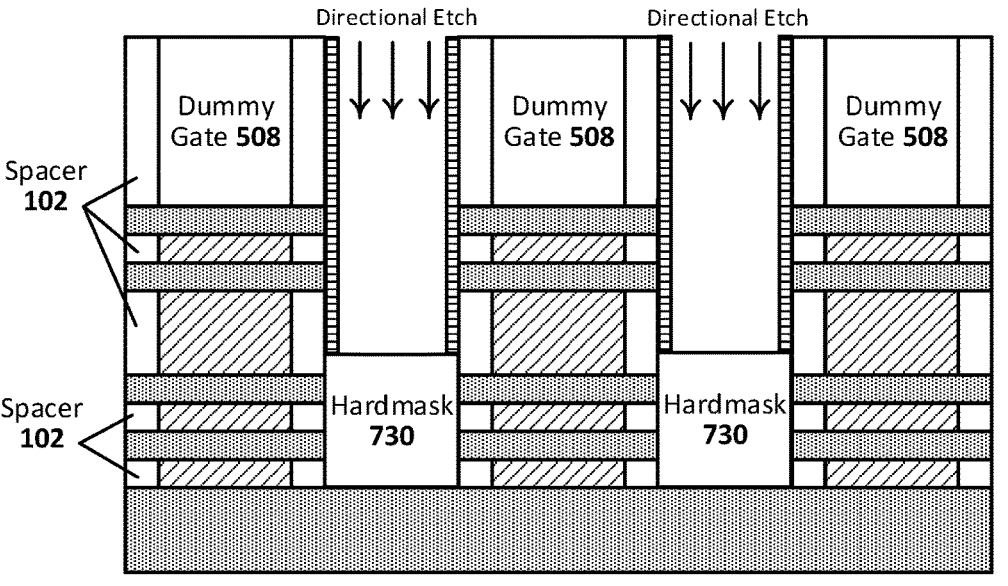

The method 612 includes patterning 701 a blocking mask in upper portion of source and drain recesses (adjacent dummy gate and upper channel region). This can be accomplished, for example, as shown in the example embodiment of FIGS. 8a-d. In particular, FIG. 8a shows the structure after the source and drain recesses have been formed, and after a hardmask 730 has been formed in the recesses. The hardmask 730 can be, for instance, a carbon hardmask that is deposited into the trench and then etched back to a desired height. Then, as shown in FIG. 8b, a blocking mask 732 is conformally deposited (e.g., via CVD or ALD) into the recess. The blocking mask 732 can be, for instance, an oxide or other material upon which epitaxial source/drain material will not grow. The thickness of mask 732 can vary from one embodiment to the next, but in some examples is in the range of 0.5 nm to 5 nm. A directional etch (e.g., anisotropic dry etch) is used to remove mask 732 from horizontal surfaces on which it has deposited, including the top surface of the hardmask 730, as shown in FIG. 8c. Then, as shown in FIG. 8d, the hardmask 730 is removed. Any standard mask removal process can be used (e.g., ash-based etch).

So, with the blocking mask 732 formed in upper portion of the recess, the methodology 612 continues with epitaxially depositing 703 the lower source and drain regions. Note that the epitaxial deposition will not deposit on the blocking mask 732, and only grows on the exposed semiconductor layers 101a in the bottom channel region. The resulting structure is shown in FIG. 8e. The method 612 continues with removing 705 the blocking mask (e.g., wet or dry etch).

Figures 8G, 8H, 8I:
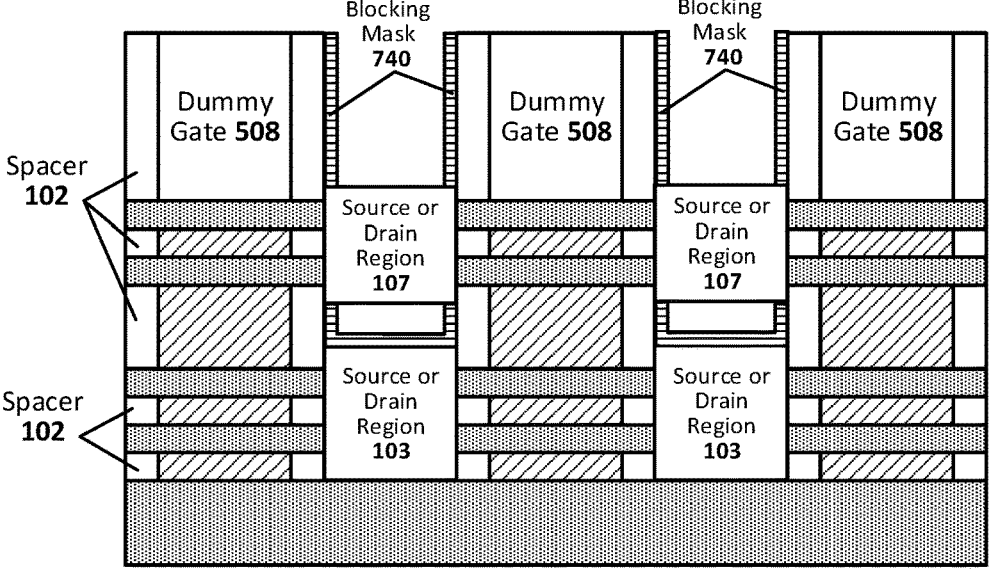
Figure 8J:
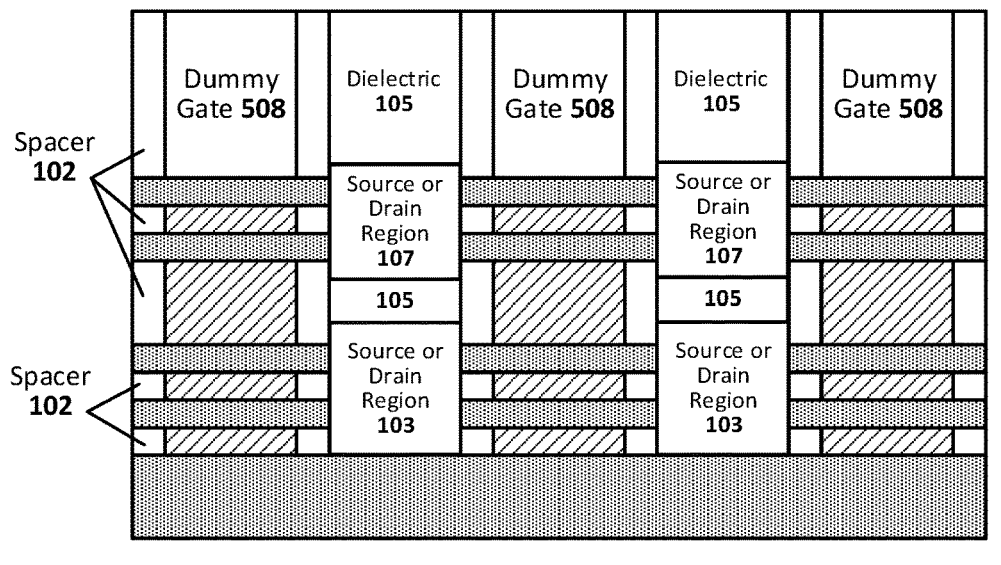

If forming the diode junction shown in FIG. 1a, then method 612 continues with patterning 707 a blocking mask on top of the lower source and drain regions. An example such process is shown in FIG. 8f-g. As can be seen in FIG. 8f, a blocking mask 734 is conformally deposited into the recess. Then, a hardmask 736 is deposited onto mask 734 and recessed to a desired height, as further shown in FIG. 8f. Note that this height corresponds to the height of dielectric layer 105 to be formed and can also be adjusted to provide a desired degree of asymmetry between the lower 103 and upper 107 diffusion areas. The excess (unmasked) portion of blocking mask 734 is then removed, as shown in FIG. 8g. Note that blocking mask 734 can be similar to blocking mask 732, and hardmask 736 can be similar to hardmask 730, and the previous relevant discussion with respect to those masks is equally appliable here. The method 612 continues with patterning 709 another blocking mask on the upper portion of source and drain recesses (adjacent dummy gate), as shown in FIG. 8h. As can be seen, a hardmask 738 is formed on the earlier formed masking structure (which corresponds to the dielectric layer 105), and recessed. Then, blocking mask 740 is conformally deposited into the recess, and directionally etched, to provide the resulting structure shown in FIG. 8h. The hardmask 738 is then removed. Again, blocking mask 740 can be similar to blocking mask 732, and hardmask 738 can be similar to hardmask 730, and the previous relevant discussion with respect to those masks is equally appliable here. With the uppermost portion of the recess blocked, the method of 612 continues with epitaxially depositing 711 the upper source and drain regions, as shown in FIG. 8i. Recall that the epitaxial growth only occurs on the exposed semiconductor layers 101a. With the upper source and drain regions formed, the method 612 continues with removing the blocking masks 734 and 740, as well as any remaining hardmask 736. A dielectric can then be deposited as noted in FIG. 6 at 614. CMP can be used to remove excess materials and planarize the resulting structure, thereby providing the structure in FIG. 8j.

Figure 9A:
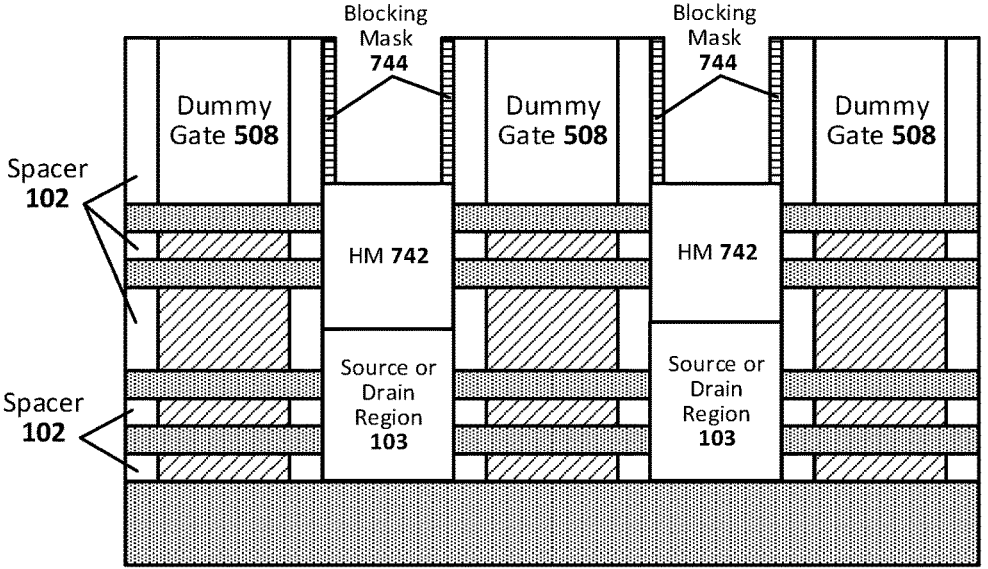
FIGS. 9a-9b are cross-sectional views that further illustrate the method of FIG. 7, in accordance with another embodiment of the present disclosure.
Figure 9B:
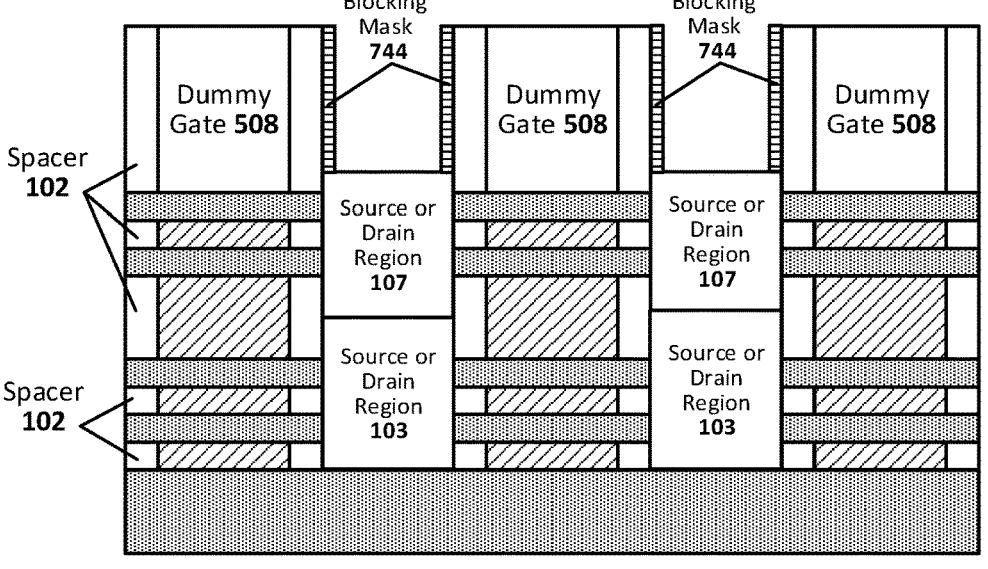

If forming the diode junction shown in FIG. 2a, then method 612 continues with patterning 715 another blocking mask on an upper portion of the source and drain recesses (adjacent dummy gate). An example such process is shown in FIG. 9a-b. As can be seen in FIG. 9a, a hardmask 742 is formed on the underlying diffusion regions 103, and recessed. Note the height of this hardmask 742 can be adjusted to set the height of the upper diffusion regions 107. Then, blocking mask 744 is conformally deposited into the recess, and directionally etched, to provide the resulting structure shown in FIG. 9a. The hardmask 742 is then removed. With the uppermost portion of the recess blocked, the method of 612 continues with epitaxially depositing 715 the upper source and drain regions on top of the lower source and drain regions, as shown in FIG. 9b. Recall that the epitaxial growth only occurs on the exposed semiconductor layers 101a. The method 612 then continues with removing 719 blocking mask 744. Again, blocking mask 744 can be similar to blocking mask 732, and hardmask 742 can be similar to hardmask 730, and the previous relevant discussion with respect to those masks is equally appliable here.

Figure 10A:
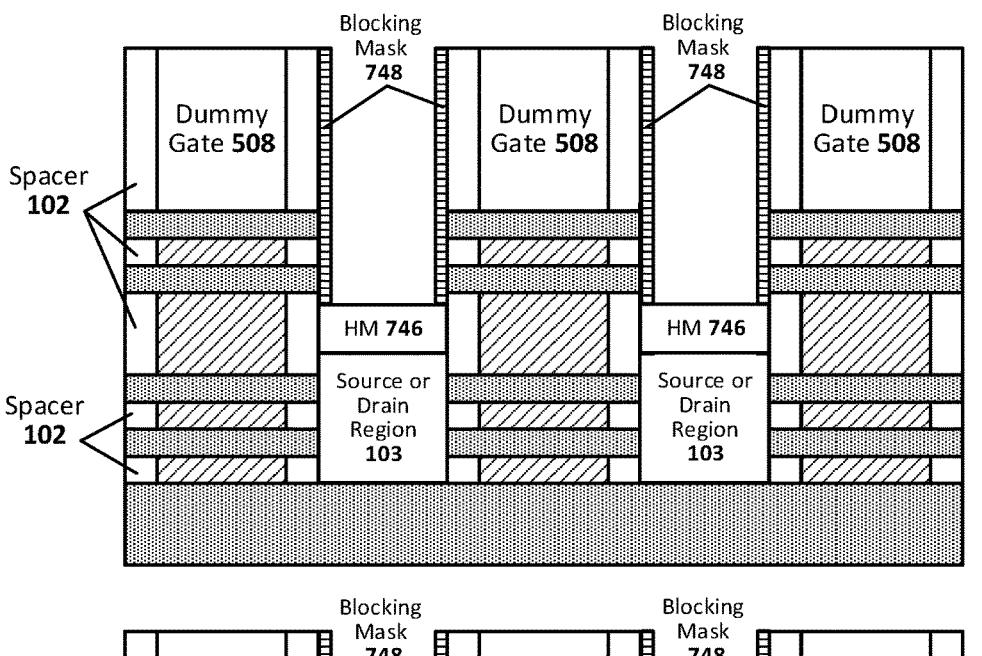
FIGS. 10a-10c are cross-sectional views that further illustrate the method of FIG. 7, in accordance with another embodiment of the present disclosure.
Figure 10B:
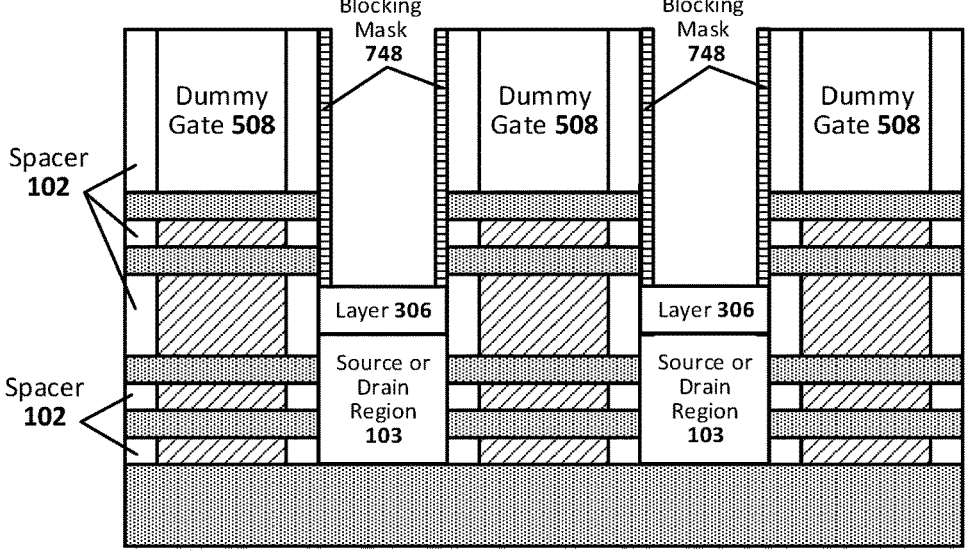
Figure 10C:
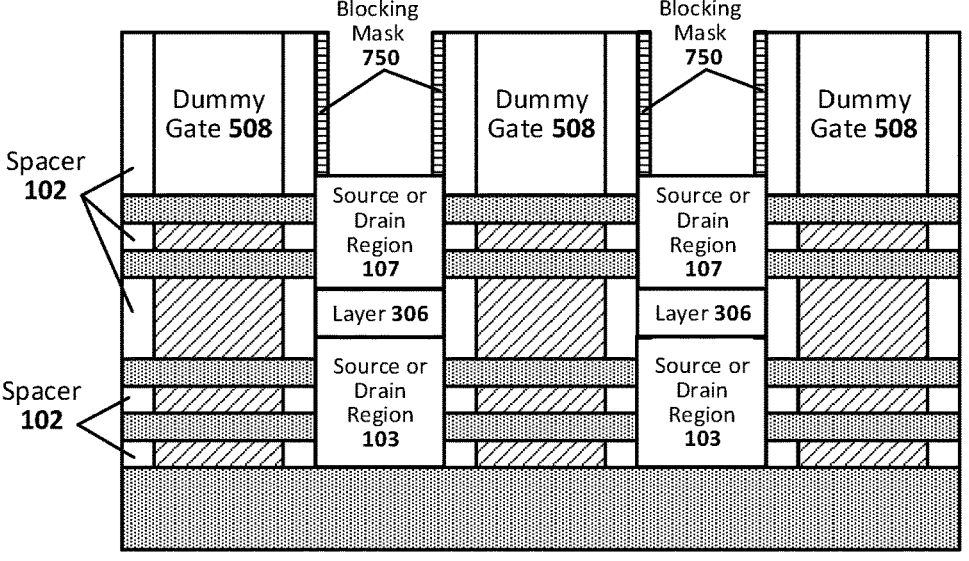

If forming the diode junction shown in FIG. 3a, then method 612 continues with patterning 721 another blocking mask on an upper portion of the source and drain recesses (adjacent dummy gate and upper channel region). An example such process is shown in FIG. 10a-b. As can be seen in FIG. 10a, a hardmask 746 is formed on the underlying diffusion regions 103, and recessed. Note the height of this hardmask 746 can be adjusted to set the height of layer 306 to be formed. Then, blocking mask 748 is conformally deposited into the recess, and directionally etched, to provide the resulting structure shown in FIG. 10a. The hardmask 746 is then removed. With the uppermost portion of the recess blocked, the method of 612 continues with epitaxially depositing 723 layer 306 (intrinsic region) on top of the lower source and drain regions, as shown in FIG. 10b. Recall that the epitaxial growth only occurs on the exposed semiconductor of the lower source and drain regions. The method 612 then continues with removing 725 blocking mask 748.

With layer 306 formed, the method 612 continues with patterning 727 another blocking mask on an upper portion of the source and drain recesses (adjacent dummy gate). An example such process includes the use of a hardmask deposited onto the underlying layer 306 and recessing of that layer to set the height of the upper diffusion regions as well as the location at which the blocking mask deposits, as variously explained in other portions of this methodology. With the uppermost portion of the recess blocked (as shown by blocking mask 750 in FIG. 10c), the method of 612 continues with epitaxially depositing 729 the upper source and drain regions on top of layer 306, as further shown in FIG. 10c. Recall that the epitaxial growth only occurs on the exposed semiconductor layers 101a and underlying layer 306. The method 612 then continues with removing 31 blocking mask 750. Again, the blocking masks and hard-masks used here can be similar to blocking mask 732 and hardmask 730, and the previous relevant discussion with respect to those masks is equally appliable here.

Computing System

Figure 11:
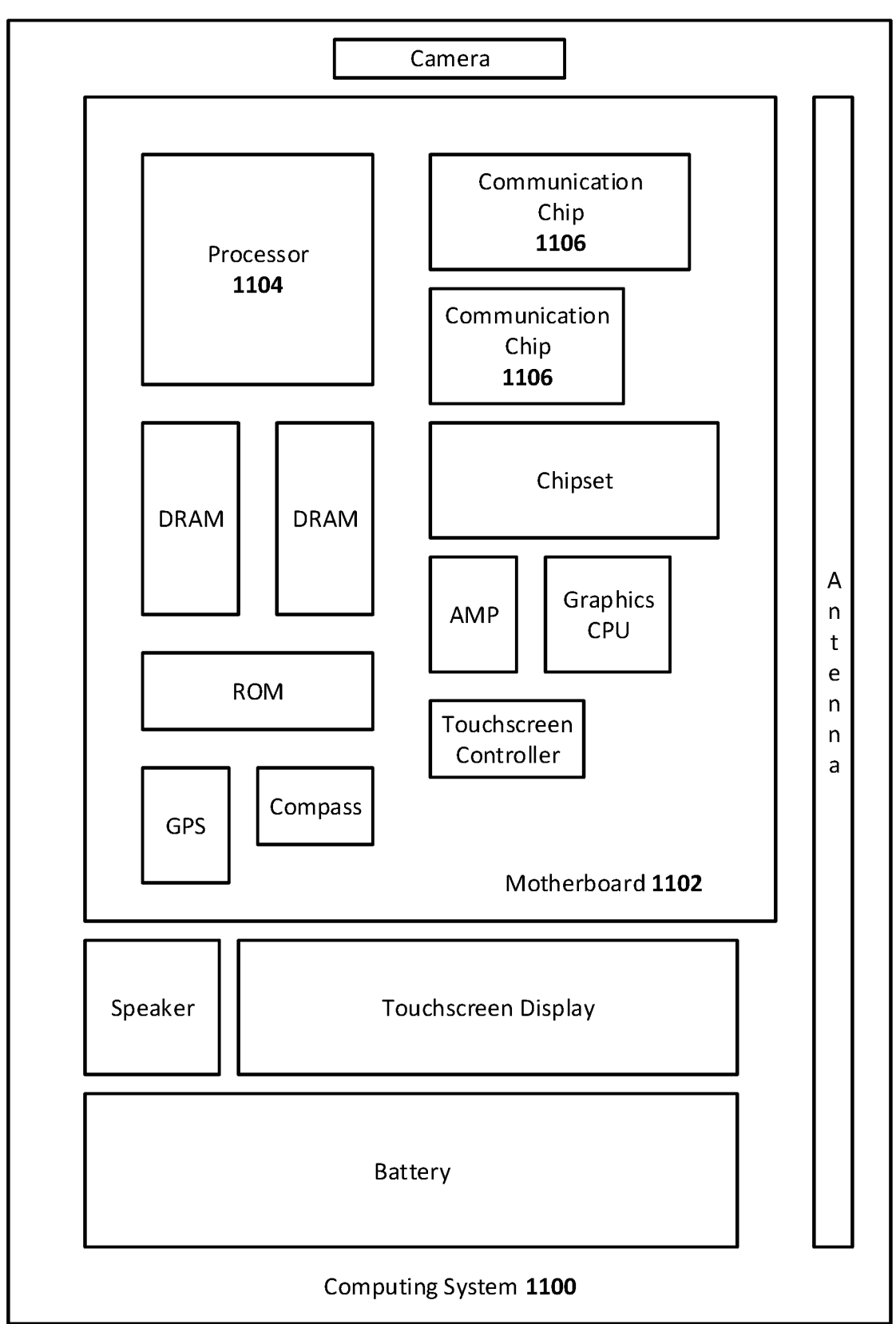
FIG. 11 illustrates a computing system implemented with one or more integrated circuit structures configured in accordance with an embodiment of the present disclosure.

FIG. 11 illustrates a computing system implemented with one or more integrated circuit structures configured in accordance with an embodiment of the present disclosure. As can be seen, the computing system 1100 houses a motherboard 1102. The motherboard 1102 may include a number of components, including but not limited to a processor 1104 and at least one communication chip 1106 (two are shown in this example), each of which can be physically and electrically coupled to the motherboard 1102, or otherwise integrated therein. As will be appreciated, the motherboard 1102 may be, for example, any printed circuit board, whether a main board or a daughterboard mounted on a main board or the only board of system 1100, etc. Depending on its applications, computing system 1100 may include one or more other components that may or may not be physically and electrically coupled to the motherboard 1102. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1100 may include one or more integrated circuits configured with a stacked transistor configuration having a vertical diode, as variously described herein. In some embodiments, multiple functions can be integrated into one or more chips (e.g., for instance, note that the communication chip 1106 can be part of or otherwise integrated into the processor 1104).

The communication chip 1106 enables wireless communications for the transfer of data to and from the computing system 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others. The processor 1104 of the computing system 1100 includes an integrated circuit die packaged within the processor 1104. In some example embodiments of the present disclosure, the integrated circuit die of the processor 1104 includes one or more occurrences of a vertical diode structure as variously provided herein. The term "processor" may refer to any device or portion of a device that processes, for instance, electronic data from registers and/or memory to transform that electronic data into other electronic data that may be stored in registers and/or memory.

The communication chip 1106 may also include an integrated circuit die packaged within the communication chip 1106. In accordance with some such example embodiments, the integrated circuit die of the communication chip 1106 includes one or more occurrences of a vertical diode structure as variously provided herein. As will be appreciated in light of this disclosure, note that multi-standard wireless capability may be integrated directly into the processor 1104 (e.g., where functionality of any chips 1106 is integrated into processor 1104, rather than having separate communication chips). Further note that processor 1104 may be a chip set having such wireless capability. In short, any number of processor 1104 and/or communication chips 1106 can be used. Likewise, any one chip or chip set can have multiple functions integrated therein.

In various implementations, the computing system 1100 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1100 may be any other electronic device that processes data or employs one or more vertical diode structures as variously provided herein. As will be appreciated in light of this disclosure, various embodiments of the present disclosure can be used to improve performance on products fabricated at any process node (e.g., in the micron range, or sub-micron and beyond) by allowing for the use of stacked transistors having any number of source/drain configurations and channel configurations, along with one or more vertical diode structures as variously provided herein.

FURTHER EXAMPLE EMBODIMENTS

The following examples pertain to further embodiments, from which numerous permutations and configurations will be apparent.

Example 1 is an integrated circuit, comprising: a first device including a first semiconductor body extending laterally from a first source or drain region, the first source or drain region comprising one of a p-type dopant or an n-type dopant; and a second device above the first device and including a second semiconductor body extending laterally from a second source or drain region, the second source or drain region comprising the other of the p-type dopant or the n-type dopant; wherein the first source or drain region and second source or drain region are at least part of a diode structure.

Example 2 includes the integrated circuit of Example 1, and further includes a layer of dielectric material between the first source or drain region and the second source or drain region, wherein the first semiconductor body and the second semiconductor body are connected to each other by a third semiconductor body.

Example 3 includes the integrated circuit of Example 2, wherein the first source or drain region, the first semiconductor body, the second semiconductor body, the third semiconductor body, and the second source or drain region are at least part of the diode structure.

Example 4 includes the integrated circuit of Example 2 or 3, wherein at least one of the first, second, and third semiconductor bodies includes an undoped portion, and wherein the first source or drain region, the first semiconductor body, the second semiconductor body, the third semiconductor body, and the second source or drain region provide a PIN junction of the diode structure. As explained herein, the undoped portion of semiconductor material can be used to provide an intrinsic region of the PIN diode structure.

Example 5 includes the integrated circuit of any one of Examples 2 through 4, wherein the first, second, and third semiconductor bodies are layers of a multilayer fin.

Example 6 includes the integrated circuit of any one of Examples 2 through 5, wherein the first and second semiconductor bodies are silicon, and the third semiconductor body includes silicon and germanium.

Example 7 includes the integrated circuit of any one of Examples 2 through 6, wherein the first, second, and third semiconductor bodies are undoped.

Example 8 includes the integrated circuit of any one of Examples 2 through 7, and further includes a spacer layer, the spacer layer being between the first and second semiconductor bodies, and the spacer layer also being between the third semiconductor body and the layer of dielectric material, the spacer layer comprising a dielectric material compositionally distinct from the layer of dielectric material between the first source or drain region and the second source or drain region.

Example 9 includes the integrated circuit of Example 1, wherein the first source or drain region and the second source or drain region are merged with one another.

Example 10 includes the integrated circuit of Example 9, wherein the first source or drain region and the second source or drain region provide a PN junction of the diode structure.

Example 11 includes the integrated circuit of Example 1, and further includes a layer of semiconductor material between the first source or drain region and the second source or drain region, the layer of semiconductor material being undoped or having an undoped portion. In some cases, the layer of semiconductor material is all undoped. In other cases, layer of semiconductor material is partially doped such that it includes one or more doped portions and one or more undoped portions, as previously explained.

Example 12 includes the integrated circuit of Example 11, wherein the first source or drain region, the layer of semiconductor material, and the second source or drain region provide a PIN junction of the diode structure.

Example 13 includes the integrated circuit of any one of Examples 1 through 12, and further includes a layer of dielectric material and/or metal between the first semiconductor body and the second semiconductor body, wherein the first semiconductor body and the second semiconductor body are nanoribbons or nanowires or nanosheets.

Example 14 includes the integrated circuit of any one of Examples 1 through 13, wherein the first semiconductor body and the second semiconductor body are unreleased nanoribbons or unreleased nanowires or unreleased nanosheets.

Example 15 includes the integrated circuit of any one of Examples 1 through 14, and further includes a gate structure on the second semiconductor body, the gate structure including a gate electrode and a high-k gate dielectric between the gate electrode and the second semiconductor body.

Example 16 includes the integrated circuit of any one of Examples 1 through 14, and further includes an isolation structure on the second semiconductor body, the isolation structure consisting essentially of, or otherwise including, dielectric material.

Example 17 includes the integrated circuit of any one of Examples 1 through 16, and further includes: a first contact on the first source or drain region; and a second contact on the second source or drain region; wherein the first contact, the first source or drain region, the second source or drain region, and the second contact are at least part of the diode structure.

Example 18 includes the integrated circuit of Example 17, wherein the first source or drain region and the second source or drain region are merged to provide at least part of a PN junction of the diode structure.

Example 19 includes the integrated circuit of Example 17, wherein the first source or drain region and the second source or drain region are separated by a layer of dielectric material, and wherein the first semiconductor body to connected to the second semiconductor body by a third semiconductor body that is compositionally different from the first and second semiconductor bodies, and wherein the first source or drain region, the first semiconductor body, the second semiconductor body, the third semiconductor body, and the second source or drain region provide at least part of a PIN junction of the diode structure.

Example 20 includes the integrated circuit of Example 17, wherein the first source or drain region and the second source or drain region are connected by a layer of semiconductor material, and wherein the first source or drain region, the layer of semiconductor material, and the second source or drain region provide at least part of a PIN junction of the diode structure.

Example 21 includes the integrated circuit of any one of Examples 1 through 20, and further includes: a first interconnect region below the first device and including one or more interconnect layers, the first interconnect region including more or more metal conductors in contact with the first contact; and/or a second interconnect region above the second device and including one or more interconnect layers, the second interconnect region including more or more metal conductors in contact with the second contact.

Example 22 is an integrated circuit, comprising: a first transistor including a first semiconductor body extending laterally between a first source region and a first drain region, the first source and drain regions comprising one of a p-type dopant or an n-type dopant; a second transistor above the first transistor and including a second semiconductor body extending laterally between a second source region and a second drain region, the second source and drain regions comprising the other of the p-type dopant or the n-type dopant; a first contact on the first source or drain region; and a second contact on the second source or drain region; wherein the first semiconductor body and the second semiconductor body are connected by a third semiconductor body, and the first, second, and third semiconductor bodies are layers of a multilayer fin, the third semiconductor body being compositionally different from the first and second semiconductor bodies; wherein the first contact, first source or drain region, second source or drain region, and second contact are at least part of a diode structure.

Example 23 includes the integrated circuit of Example 22, and further includes a layer of dielectric material between the first source or drain region and the second source or drain region.

Example 24 includes the integrated circuit of Example 23, wherein at least one of the first, second, and third semiconductor bodies includes an undoped portion, wherein the first source or drain region, the first semiconductor body, the second semiconductor body, the third semiconductor body, and the second source or drain region provide at least part of a PIN junction of the diode structure.

Example 25 includes the integrated circuit of Example 23, and further includes a spacer layer, the spacer layer being between the first and second semiconductor bodies, and the spacer layer also being between the third semiconductor body and the layer of dielectric material, the spacer layer comprising a dielectric material compositionally distinct from the layer of dielectric material between the first source or drain region and the second source or drain region.

Example 26 includes the integrated circuit of Example 22, wherein the first source or drain region and the second source or drain region are merged with one another.

Example 27 includes the integrated circuit of Example 26, wherein the first source or drain region and the second source or drain region provide a PN junction of the diode structure.

Example 28 includes the integrated circuit of Example 22, and further includes a layer of semiconductor material between the first source or drain region and the second source or drain region, the layer of semiconductor material being undoped or having an undoped portion. In some cases, the layer of semiconductor material is all undoped. In other cases, layer of semiconductor material is partially doped such that it includes one or more doped portions and one or more undoped portions, as previously explained.

Example 29 includes the integrated circuit of Example 28, wherein the first source or drain region, the layer of semiconductor material, and the second source or drain region provide a PIN junction of the diode structure.

Example 30 includes the integrated circuit of any one of Examples 22 through 29, and further includes a layer of dielectric material and/or metal between the first semiconductor body and the second semiconductor body, wherein the first semiconductor body and the second semiconductor body are nanoribbons or nanowires or nanosheets.

Example 31 includes the integrated circuit of any one of Examples 22 through 30, and further includes a gate structure on one of the first or second semiconductor bodies, the gate structure including a gate electrode and a high-k gate dielectric between the gate electrode and the corresponding semiconductor body.

Example 32 includes the integrated circuit of any one of Examples 22 through 30, and further includes an isolation structure on one of the first or second semiconductor bodies, the isolation structure consisting essentially of, or otherwise including, dielectric material.

Example 33 is an integrated circuit, comprising: a first transistor including a first semiconductor body extending laterally between a first source region and a first drain region, the first source and drain regions comprising one of a p-type dopant or an n-type dopant; a second transistor above the first transistor and including a second semiconductor body extending laterally between a second source region and a second drain region, the second source and drain regions comprising the other of the p-type dopant or the n-type dopant; a spacer layer, the spacer layer being between the first and second semiconductor bodies, and the spacer layer also being laterally adjacent to a diode junction, the diode junction provided at least in part by the first source or drain region and the second source or drain region; a first contact on the first source or drain region; and a second contact on the second source or drain region.

Example 34 includes the integrated circuit of Example 33, and further includes a layer of dielectric material between the first source or drain region and the second source or drain region, and the diode junction is provided at least in part by the first source or drain region, the first semiconductor body, the second semiconductor body, and the second source or drain region.

Example 35 includes the integrated circuit of Example 34, and further includes a third semiconductor body between the first and second semiconductor bodies, and the diode junction is provided at least in part by the first source or drain region, the first semiconductor body, the second semiconductor body, the third semiconductor body, and the second source or drain region.

Example 36 includes the integrated circuit of Example 34 or 35, wherein the diode junction is a PIN junction.

Example 37 includes the integrated circuit of Example 33, wherein the second source or drain region is on the first source or drain region.

Example 38 includes the integrated circuit of Example 37, wherein the diode junction is a PN junction.

Example 39 includes the integrated circuit of Example 33, and further includes a layer of undoped semiconductor material between the first source or drain region and the second source or drain region, and the diode junction is provided at least in part by the first source or drain region, the layer of undoped semiconductor material, and the second source or drain region.

Example 40 includes the integrated circuit of Example 39, wherein the diode junction is a PIN junction.

Example 41 includes the integrated circuit of any one of Examples 33 through 40, and further includes a layer of dielectric material and/or metal between the first semiconductor body and the second semiconductor body, wherein the first semiconductor body and the second semiconductor body are nanoribbons or nanowires or nanosheets.

Example 42 includes the integrated circuit of any one of Examples 33 through 41, and further includes a gate structure on one of the first or second semiconductor bodies, the gate structure including a gate electrode and a high-k gate dielectric between the gate electrode and the corresponding semiconductor body.

Example 43 includes the integrated circuit of any one of Examples 33 through 41, and further includes an isolation structure on one of the first or second semiconductor bodies, the isolation structure consisting essentially of, or otherwise including, dielectric material.

Example 44 is an integrated circuit, comprising: a first device including a first semiconductor body extending laterally from a first diffusion region, the first diffusion region comprising one of a p-type dopant or an n-type dopant; and a second device above the first device and including a second semiconductor body extending laterally from a second diffusion region, the second diffusion region comprising the other of the p-type dopant or the n-type dopant; wherein the first diffusion region and second diffusion region are at least part of a diode structure.

Example 45 includes the integrated circuit of Example 44, and further includes: a first contact on the first diffusion region; and a second contact on the second diffusion region.

Example 46 includes the integrated circuit of Example 44 or 45, and further includes: a gate structure on the second semiconductor body; and a third semiconductor body on the first semiconductor body.

Example 47 includes the integrated circuit of Example 44 or 45, and further includes: a dielectric structure on the second semiconductor body; and a third semiconductor body on the first semiconductor body.

Example 48 includes the integrated circuit of any one of Examples 44 through 47, wherein the second diffusion region is on a top surface of the first diffusion region.

Example 49 includes the integrated circuit of Example 48, wherein the first diffusion region and second diffusion region form a PN junction of the diode structure.

Example 50 includes the integrated circuit of any one of Examples 44 through 47, and further includes: a layer comprising dielectric material on a top surface of the first diffusion region, wherein the second diffusion region is on a top surface of the layer, the layer separating the first and second diffusion regions from one another; and a third semiconductor body connecting the first semiconductor body to the second semiconductor body, the third semiconductor body being compositionally different from the first and second semiconductor bodies.

Example 51 includes the integrated circuit of Example 50, wherein the first diffusion region, the first semiconductor body, the second semiconductor body, and the second diffusion region form at least part of a PIN junction of the diode structure.

Example 52 includes the integrated circuit of any one of Examples 44 through 47, and further includes: a layer comprising semiconductor material on a top surface of the first diffusion region, wherein the second diffusion region is on a top surface of the layer, the layer separating the first and second diffusion regions from one another and being undoped or having an undoped portion.

Example 53 includes the integrated circuit of Example 52, wherein the first diffusion region, the layer, and the second diffusion region form at least part of a PIN junction of the diode structure.

Example 54 includes the integrated circuit of any one of Examples 44 through 49 and 52 through 53, wherein the first device further includes a third diffusion region and a third semiconductor body extending laterally from the third diffusion region toward the first semiconductor body and the first diffusion region; and an isolation structure between and separating the first diffusion region and first semiconductor body from the third diffusion region and third semiconductor body.

Example 55 includes the integrated circuit of any one of Examples 44 through 49 and 52 through 54, wherein the second device further includes a third diffusion region and a third semiconductor body extending laterally from the third diffusion region toward the second semiconductor body and the second diffusion region; and an isolation structure between and separating the second diffusion region and second semiconductor body from the third diffusion region and third semiconductor body.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
   a first device including a first semiconductor body extending laterally from a first source or drain region, the first source or drain region comprising one of a p-type dopant or an n-type dopant; and
   a second device above the first device and including a second semiconductor body extending laterally from a second source or drain region, the second source or drain region comprising the other of the p-type dopant or the n-type dopant;
   wherein the first source or drain region and second source or drain region are at least part of a same diode structure.

2. The integrated circuit of claim 1, further comprising a layer of dielectric material between the first source or drain region and the second source or drain region, wherein the first semiconductor body and the second semiconductor body are connected to each other by a third semiconductor body.

3. The integrated circuit of claim 2, wherein the first source or drain region, the first semiconductor body, the second semiconductor body, the third semiconductor body, and the second source or drain region are at least part of the same diode structure.

4. The integrated circuit of claim 3, wherein at least one of the first, second, and third semiconductor bodies includes an undoped portion, and wherein the first source or drain region, the first semiconductor body, the second semiconductor body, the third semiconductor body, and the second source or drain region provide a PIN junction of the same diode structure.

5. The integrated circuit of claim 2, wherein the first, second, and third semiconductor bodies are layers of a multilayer fin.

6. The integrated circuit of claim 2, wherein the first and second semiconductor bodies are silicon, and the third semiconductor body includes silicon and germanium.

7. The integrated circuit of claim 2, wherein the first, second, and third semiconductor bodies are undoped.

8. The integrated circuit of claim 2, further comprising a spacer layer, the spacer layer being between the first and second semiconductor bodies, and the spacer layer also being between the third semiconductor body and the layer of dielectric material, the spacer layer comprising a dielectric material compositionally distinct from the layer of dielectric material between the first source or drain region and the second source or drain region.

9. The integrated circuit of claim 1, wherein the first source or drain region and the second source or drain region are merged with one another.

10. The integrated circuit of claim 9, wherein the first source or drain region and the second source or drain region provide a PN junction of the same diode structure.

11. The integrated circuit of claim 1, further comprising a layer of semiconductor material between the first source or drain region and the second source or drain region, the layer of semiconductor material being undoped or having an undoped portion.

12. The integrated circuit of claim 11, wherein the first source or drain region, the layer of semiconductor material, and the second source or drain region provide a PIN junction of the same diode structure.

13. The integrated circuit of claim 1, further comprising a layer of dielectric material and/or metal between the first semiconductor body and the second semiconductor body, wherein the first semiconductor body and the second semiconductor body are nanoribbons or nanowires or nanosheets.

14. The integrated circuit of claim 1, wherein the first semiconductor body and the second semiconductor body are unreleased nanoribbons or unreleased nanowires or unreleased nanosheets.

15. The integrated circuit of claim 1, further comprising a gate structure on the second semiconductor body, the gate structure including a gate electrode and a high-k gate dielectric between the gate electrode and the second semiconductor body.

16. The integrated circuit of claim 1, further comprising an isolation structure on the second semiconductor body, the isolation structure including dielectric material.

17. The integrated circuit of claim 1, further comprising:
a first contact on the first source or drain region; and
a second contact on the second source or drain region;
wherein the first contact, the first source or drain region, the second source or drain region, and the second contact are at least part of the same diode structure.

18. An integrated circuit, comprising:
a first semiconductor body extending laterally between a first source region and a first drain region, the first source and drain regions comprising one of a p-type dopant or an n-type dopant;
a second semiconductor body above the first semiconductor body and extending laterally between a second source region and a second drain region, the second source and drain regions comprising the other of the p-type dopant or the n-type dopant;
a spacer layer, the spacer layer being between the first and second semiconductor bodies, and the spacer layer also being laterally adjacent to a diode junction, the diode junction provided at least in part by the first source or drain region and the second source or drain region;
a first contact on the first source or drain region; and
a second contact on the second source or drain region.

19. The integrated circuit of claim 18, further comprising:
a layer of dielectric material between the first source or drain region and the second source or drain region, and the diode junction is provided at least in part by the first source or drain region, the first semiconductor body, the second semiconductor body, and the second source or drain region; and
a third semiconductor body between the first and second semiconductor bodies, and the diode junction is provided at least in part by the first source or drain region, the first semiconductor body, the second semiconductor body, the third semiconductor body, and the second source or drain region.

20. The integrated circuit of claim 18, wherein the second source or drain region is on the first source or drain region.

21. The integrated circuit of claim 18, further comprising a layer of semiconductor material between the first source or drain region and the second source or drain region, the layer of semiconductor material being undoped or having an undoped portion, and the diode junction is provided at least in part by the first source or drain region, the layer of semiconductor material, and the second source or drain region.

22. An integrated circuit, comprising:
a first device including a first semiconductor body extending laterally from a first diffusion region, the first diffusion region comprising one of a p-type dopant or an n-type dopant; and
a second device above the first device and including a second semiconductor body extending laterally from a second diffusion region, the second diffusion region comprising the other of the p-type dopant or the n-type dopant;
wherein the first diffusion region and second diffusion region are at least part of a same diode structure.

23. The integrated circuit of claim 22, wherein the second diffusion region is on a top surface of the first diffusion region.

24. The integrated circuit of claim 22, comprising:
a layer comprising dielectric material on a top surface of the first diffusion region, wherein the second diffusion region is on a top surface of the layer, the layer separating the first and second diffusion regions from one another; and
a third semiconductor body connecting the first semiconductor body to the second semiconductor body, the third semiconductor body being compositionally different from the first and second semiconductor bodies.

25. The integrated circuit of claim 22, comprising:
a layer comprising semiconductor material on a top surface of the first diffusion region, wherein the second diffusion region is on a top surface of the layer, the layer separating the first and second diffusion regions from one another and being undoped or having an undoped portion.

* * * * *